US012812861B2

(12) United States Patent
Choi et al.

(10) Patent No.: US 12,812,861 B2
(45) Date of Patent: Nov. 24, 2026

(54) SEMICONDUCTOR MEMORY DEVICE AND METHOD OF MANUFACTURING THE SAME

(71) Applicant: SK hynix Inc., Gyeonggi-do (KR)

(72) Inventors: Seok Min Choi, Gyeonggi-do (KR); Jung Shik Jang, Gyeonggi-do (KR); Rho Gyu Kwak, Gyeonggi-do (KR); In Su Park, Gyeonggi-do (KR); Won Geun Choi, Gyeonggi-do (KR); Jung Dal Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 402 days.

(21) Appl. No.: 18/534,744

(22) Filed: Dec. 11, 2023

(65) Prior Publication Data

US 2025/0071989 A1 Feb. 27, 2025

(30) Foreign Application Priority Data

Aug. 25, 2023 (KR) ........................ 10-2023-0111907

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27* (2023.02); *H10B 41/41* (2023.02); *H10B 43/40* (2023.02);
(Continued)

(58) Field of Classification Search
CPC ........ H10B 43/27; H10B 41/27; H10B 41/41; H10B 43/40; H10B 80/00; H10B 43/10; H10B 43/50; H10B 41/30; H10B 43/30; H10B 51/20; H10B 51/30; H10B 53/20; H10B 53/30; H10B 41/40; H10B 41/50; H10W 90/00; H10W 90/792; G11C 5/025; G11C 5/063
See application file for complete search history.

(56) References Cited

U.S. PATENT DOCUMENTS

| | | | | |
|---|---|---|---|---|
| 2019/0043836 | A1* | 2/2019 | Fastow | H10B 43/40 |
| 2022/0246213 | A1* | 8/2022 | Takekida | G11C 16/0483 |
| 2022/0310541 | A1* | 9/2022 | Na | H10W 90/00 |

FOREIGN PATENT DOCUMENTS

| | | | | | |
|---|---|---|---|---|---|
| KR | 10-2022-0034273 | A | | 3/2022 | |
| KR | 20220034273 | A | * | 3/2022 | H10W 90/00 |
| KR | 10-2022-0133364 | A | | 10/2022 | |

* cited by examiner

*Primary Examiner* — Evan G Clinton
(74) *Attorney, Agent, or Firm* — IP & T GROUP LLP

(57) ABSTRACT

The present technology relates to a semiconductor memory device and a method of manufacturing the same. The semiconductor memory device includes a first stack structure, a plurality of first slits passing through the first stack structure in a vertical direction and extending in a first horizontal direction orthogonal to the vertical direction, a first source line layer contacting an a top portion of the first stack structure, a second source line layer directly contacting the first source line layer, a second stack structure contacting the second source line layer and overlapping with the first stack structure in the vertical direction, and a plurality of second slits passing through the second stack structure in the vertical direction and extending in a second horizontal direction orthogonal to the vertical direction.

19 Claims, 30 Drawing Sheets

(51) Int. Cl.

| | |
|---|---|
| ***H10B 41/41*** | (2023.01) |
| ***H10B 43/40*** | (2023.01) |
| ***H10B 80/00*** | (2023.01) |
| ***H10W 90/00*** | (2026.01) |

(52) U.S. Cl.
CPC ............ *H10B 80/00* (2023.02); *H10W 90/00* (2026.01); *H10W 90/792* (2026.01)

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2023-0111907 filed on Aug. 25, 2023, the entire disclosure of which is incorporated by reference herein.

BACKGROUND

1. Field of Invention

Embodiments of the present disclosure relate to an electronic device, and more particularly, to a semiconductor memory device having a vertical channel structure and a method of manufacturing the same.

2. Description of Related Art

Semiconductor memory devices are largely categorized into volatile memory devices and nonvolatile memory devices.

A write speed and a read speed of a nonvolatile memory device are relatively slow compared to those of a volatile memory device, however, unlike a volatile memory device, a nonvolatile memory device maintains storage data even when power supply is cut off. Therefore, a nonvolatile memory device is used to store data to be maintained regardless of power supply. Examples of a nonvolatile memory device include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. A flash memory is typically categorized as a NOR or a NAND type.

SUMMARY

An embodiment of the present disclosure provides a semiconductor device having a stable structure and an improved characteristic and a method of manufacturing the same.

According to an embodiment of the present disclosure, a semiconductor memory device includes a first stack structure, a plurality of first slits passing through the first stack structure in a vertical direction and extending in a first horizontal direction orthogonal to the vertical direction, a first source line layer contacting a top portion of the first stack structure, a second source line layer directly contacting the first source line layer, a second stack structure contacting the second source line layer and overlapping with the first stack structure in the vertical direction, and a plurality of second slits passing through the second stack structure in the vertical direction and extending in a second horizontal direction orthogonal to the vertical direction.

According to an embodiment of the present disclosure, a semiconductor memory device includes a first memory chip structure including first and second plane regions each including a plurality of first stack structures, a second memory chip structure bonded to a top surface of the first memory chip structure in a vertical direction and including third and fourth plane regions each including a plurality of second stack structures, and a third memory chip structure bonded to a bottom surface of the first memory chip structure in the vertical direction, and including first and second page buffer regions where a page buffer for controlling an operation of memory cells included in the first memory chip structure and the second memory chip structure is disposed, and first and second row decoder regions where a row decoder for controlling the operation of the memory cells is disposed. The first memory chip structure includes first slits passing through the plurality of first stack structures in the vertical direction and extending in a first horizontal direction orthogonal to the vertical direction, and the second memory chip structure includes second slits passing through the plurality of second stack structures in the vertical direction and extending in a second horizontal direction orthogonal to the vertical direction and the first horizontal direction.

According to an embodiment of the present disclosure, a semiconductor memory device includes a first memory chip structure including first to fourth stack structures arranged in a matrix form, a second memory chip structure bonded to a top surface of the first memory chip structure in a vertical direction and including fifth to eighth stack structures arranged in the matrix form, and a third memory chip structure bonded to a bottom surface of the first memory chip structure in the vertical direction, and including first and second page buffer regions where a page buffer for controlling an operation of memory cells included in the first memory chip structure and the second memory chip structure is disposed, and first to eighth row decoder regions where a row decoder for controlling the operation of the memory cells is disposed. The first memory chip structure includes first slits passing through the plurality of first stack structures in the vertical direction and extending in a first horizontal direction orthogonal to the vertical direction, and the second memory chip structure includes second slits passing through the plurality of second stack structures in the vertical direction and extending in a second horizontal direction orthogonal to the vertical direction and the first horizontal direction.

According to an embodiment of the present disclosure, a semiconductor memory device includes a first memory chip structure including first and second plane regions each including a plurality of first stack structures, a second memory chip structure bonded to a top surface of the first memory chip structure in a vertical direction and including third and fourth plane regions each including a plurality of second stack structures, and a third memory chip structure bonded to a bottom surface of the first memory chip structure in the vertical direction, and including first to fourth page buffer regions where a page buffer for controlling an operation of memory cells included in the first memory chip structure and the second memory chip structure is disposed, and first to fourth row decoder regains where a row decoder for controlling the operation of the memory cells is disposed. The first memory chip structure includes first slits passing through the plurality of first stack structures in the vertical direction and extending in a first horizontal direction orthogonal to the vertical direction, and the second memory chip structure includes second slits passing through the plurality of second stack structures in the vertical direction and extending in a second horizontal direction orthogonal to the vertical direction and the first horizontal direction.

According to an embodiment of the present disclosure, a method of manufacturing a semiconductor memory may include forming a first stack structure, and forming, by the first stack structure, a lower stack structure including first interlayer insulating layers and second word line patterns alternately stacked in a vertical direction, first cell plugs having an end extending upwardly by passing through the lower stack structures, a plurality of first slits extending in a first horizontal direction orthogonal to the vertical direction by passing through the lower stack structure in the vertical direction, and a first source line layer stacked on the lower stack structure and connected to the end of first cell plugs, and forming a second stack structure on the first stack structure, and forming a second source line layer directly contacting the first source line layer, an upper stack structure including second interlayer insulating layers and third word line patterns alternately stacked in the vertical direction, second cell plugs extending downwardly by passing through the upper stack structure and having an end contacting the second source line layer, a plurality of second slits extending in a second horizontal direction orthogonal to the vertical direction and the first horizontal direction by passing through the upper stack structure in the vertical direction.

According to an embodiment of the present disclosure, a method of manufacturing a semiconductor memory may include forming a first stack structure on a first substrate, and forming, by the first stack structure, a lower stack structure including first interlayer insulating layers and second word line patterns alternately stacked in a vertical direction, first cell plugs having an end extending upwardly by passing through the lower stack structures, a plurality of first slits extending in a first horizontal direction orthogonal to the vertical direction by passing through the lower stack structure in the vertical direction, and a first source line layer stacked on the lower stack structure and connected to the end of first cell plugs, forming a first bonding pad exposed to an upper surface within the first source line layer, forming a second stack structure on a second substrate, and forming, by the second stack structure, an upper stack structure including second interlayer insulating layers and third word line patterns alternately stacked in the vertical direction, second cell plugs having an end extending upwardly by passing through the upper stack structures, a plurality of second slits extending in a second horizontal direction orthogonal to the vertical direction and the first horizontal direction by passing through the upper stack structure in the vertical direction, and a second source line layer stacked on the upper stack structure and connected to the end of first cell plugs, forming a second bonding pad exposed to an upper surface within the second source line layer, and aligning the first source line layer of the first substrate and the second source line layer of the second substrate so that the first source line layer and the second source line layer face each other and then performing a bonding process to bond the first source line layer and the second source line layer.

In an embodiment of the present disclosure, slits passing through a stack structure of a first memory chip structure and slits passing through a stack structure of a second memory chip structure are disposed to cross each other. Therefore, a warpage phenomenon at an interface between the first memory chip structure and the second memory chip structure may be improved, and a source line layer of the first memory chip structure and a source line layer of the second memory chip structure may be shared by directly bonding the source line layer of the first memory chip structure and the source line layer of the second memory chip structure.

These and other features and advantages of the present invention will become better understood from the following figures and detailed description of the present invention.

DETAILED DESCRIPTION

Specific structural or functional descriptions of embodiments according to the concepts which are disclosed in the present specification are illustrated only to describe the embodiments according to the concepts of the present disclosure. The embodiments according to the concepts of the present disclosure may be carried out in various forms and should not be construed as being limited to the embodiments described in the present specification.

Hereinafter, embodiments of the present disclosure will be described with reference to the accompanying drawings in order to describe them in sufficient detail to allow those of ordinary skill in the art to readily implement the present invention.

Figure 1:
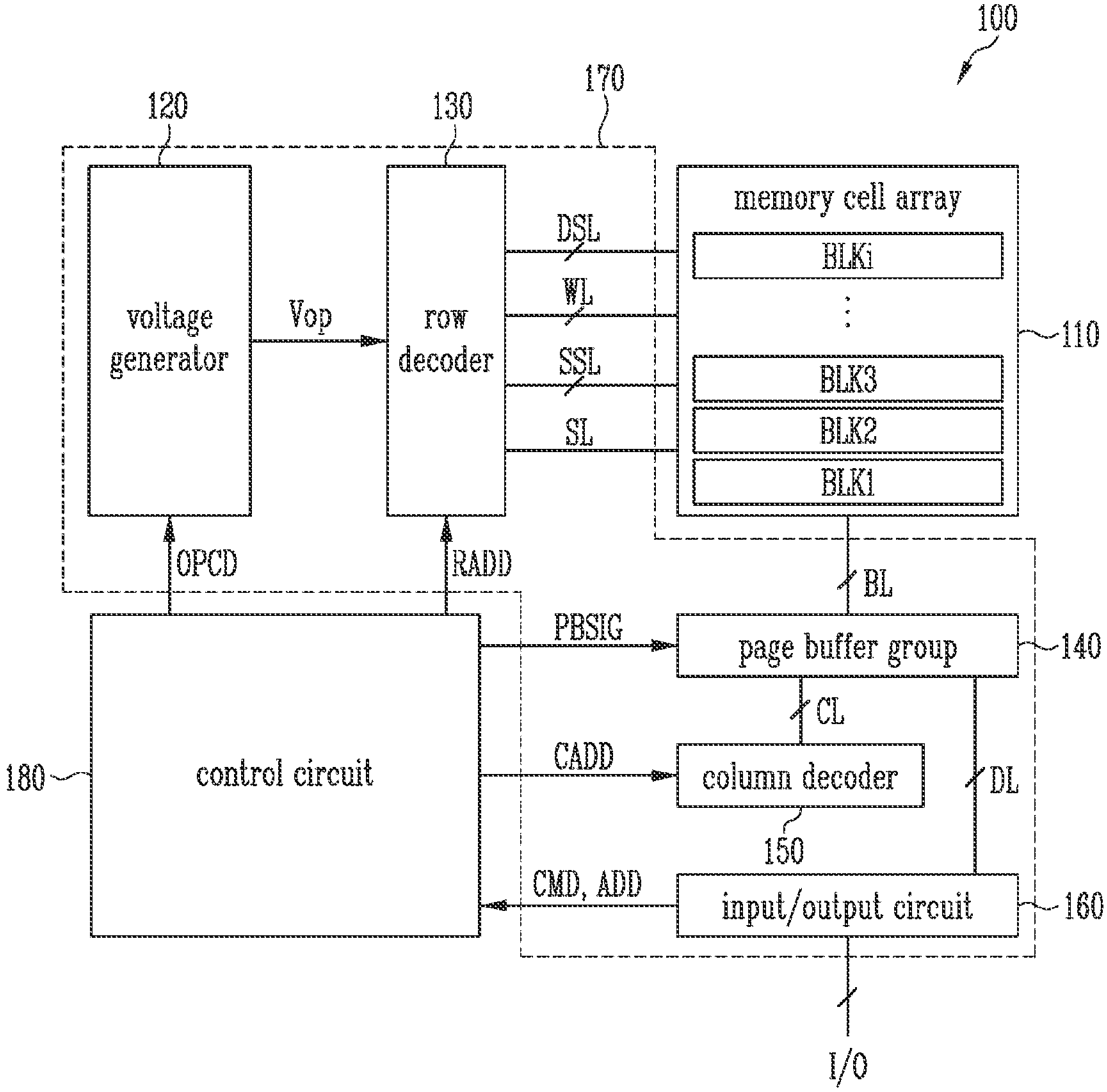
FIG. 1 is a diagram illustrating a semiconductor memory device.

FIG. 1 is a diagram illustrating a semiconductor memory device.

Referring to FIG. 1, the semiconductor memory device 100 may include a memory cell array 110, a peripheral circuit 170, and a control circuit 180.

The memory cell array 110 may include first to i-th memory blocks BLK1 to BLKi, where i is a positive integer. Each of the first to i-th memory blocks BLK1 to BLKi may include memory cells capable of storing data. Drain select lines DSL, word lines WL, source select lines SSL, and a source line SL may be connected to each of the first to i-th memory blocks BLK1 to BLKi, and a bit line BL may be commonly connected to the first to i-th memory blocks BLK1 to BLKi.

In the present disclosure, a memory region may indicate a memory plane or a memory block. In the present disclosure, for convenience of description, a description is given based on that the memory region is a memory block, but the present disclosure is not limited thereto.

The first to i-th memory blocks BLK1 to BLKi may be formed in a three-dimensional structure. The memory blocks having the three-dimensional structure may include memory cells stacked on a substrate in a vertical direction.

The memory cells may store 1 bit or 2 bits or more of data according to a program method. For example, a method in which 1 bit of data is stored in one memory cell is referred to as a single level cell method, and a method in which 2 bits of data is stored in one memory cell is referred to as a multi-level cell method. A method in which 3 bits of data is stored in one memory cell is referred to as a triple level cell method, and a method in which 4 bits of data is stored in one memory cell is referred to as a quad level cell method. In addition to this, five bits or more of data may be stored in one memory cell.

The peripheral circuit 170 may be configured to perform a program operation of storing data in the memory cell array 110, a read operation of outputting the data stored in the memory cell array 110, and an erase operation of erasing the data stored in the memory cell array 110. For example, the peripheral circuit 170 may include a voltage generator 120, a row decoder 130, a page buffer group 140, a column decoder 150, and an input/output circuit 160.

The voltage generator 120 may generate various operation voltages Vop used for the program operation, the read operation, or the erase operation in response to an operation code OPCD received from the control circuit 180. For example, the voltage generator 120 may be configured to generate program voltages, turn-on voltages, turn-off voltages, negative voltages, precharge voltages, verify voltages, read voltages, pass voltages, or erase voltages in response to the operation code OPCD. The operation voltages Vop generated by the voltage generator 120 may be applied to the drain select lines DSL, the word lines WL, the source select lines SSL, and the source line SL of memory block selected through the row decoder 130.

The program voltages may be voltages applied to a selected word line among the word lines WL during the program operation, and may be used to increase a threshold voltage of memory cells connected to the selected word line. The turn-on voltages may be applied to the drain select lines DSL or the source select lines SSL, and may be used to turn on drain select transistors or source select transistors. The turn-off voltages may be applied to the drain select lines DSL or the source select lines SSL, and may be used to turn off the drain select transistors or the source select transistors. For example, the turn-off voltage may be set to OV. The precharge voltages may be a voltage higher than OV, and may be applied to bit lines during the read operation. The verify voltages may be used during a verify operation for determining whether a threshold voltage of selected memory cells is increased to a target level. The verify voltages may be set to various levels according to the target level and may be applied to the selected word line.

The read voltages may be applied to the selected word line during the read operation of the selected memory cells. For example, the read voltages may be set to various levels according to a program method of the selected memory cells.

The pass voltages may be voltages applied to unselected word lines among the word lines WL during the program or read operation, and may be used to turn on memory cells connected to the unselected word lines. In the read operation according to the present embodiment, the pass voltages may include a target pass voltage set to the highest and sub-pass voltages lower than the target pass voltage. For example, before the read voltage is applied to the selected word line, the sub-pass voltages may be applied to adjacent word lines adjacent to the selected word line. When the sub-pass voltages are applied to the adjacent word lines, the target pass voltage may be applied to the remaining unselected word lines. When the read voltage is applied to the selected word line, the target pass voltage may be applied to the adjacent word lines.

The erase voltages may be used during the erase operation for erasing memory cells included in the selected memory block, and may be applied to the source line SL.

The row decoder 130 may be configured to transmit the operation voltages Vop to the drain select lines DSL, the word lines WL, the source select lines SSL, and the source line SL connected to the selected memory block according to a row address RADD. For example, the row decoder 130 may be connected to the voltage generator 120 through global lines, and may be connected to the first to i-th memory blocks BLK1 to BLKi through the drain select lines DSL, the word lines WL, the source select lines SSL, and the source line SL.

The page buffer group 140 may include page buffers PB1 to PBn (not shown) connected to the first to i-th memory blocks BLK1 to BLKi. Each of the page buffers (not shown) may be connected to the first to i-th memory blocks BLK1 to BLKi through the bit lines BL. During the read operation, the page buffers (not shown) may sense a current or a voltage of the bit lines which varies according to threshold voltages of the selected memory cells, and temporarily store the sensed data, in response to page buffer control signals PBSIG.

The column decoder 150 may be configured so that data is transmitted between the page buffer group 140 and the input/output circuit 160 in response to a column address CADD. For example, the column decoder 150 may be connected to the page buffer group 140 through column lines CL and may transmit enable signals through the column lines CL. The page buffers (not shown) included in the page buffer group 140 may receive or output the data through data lines DL in response to the enable signals.

The input/output circuit 160 may be configured to receive or output a command CMD, an address ADD, or data through input/output lines I/O. For example, the input/output circuit 160 may transmit the command CMD and the address ADD received from an external controller to the control circuit 180 through the input/output lines I/O, and transmit the data received from the external controller to the page buffer group 140 through the input/output lines I/O. Alternatively, the input/output circuit 160 may output the data received from the page buffer group 140 to the external controller through the input/output lines I/O.

The control circuit 180 may output at least one of the operation code OPCD, the row address RADD, the page buffer control signals PBSIG, or the column address CADD in response to the command CMD and the address ADD. For example, when the command CMD input to the control circuit 180 is a command corresponding to the program operation, the control circuit 180 may control the peripheral circuit 170 to perform the program operation of a memory block selected by the address ADD. When the command CMD input to the control circuit 180 is a command corresponding to the read operation, the control circuit 180 may control the peripheral circuit 170 to perform the read operation of the memory block selected by the address and output the read data. When the command CMD input to the control circuit 180 is a command corresponding to the erase operation, the control circuit 180 may control the peripheral circuit 170 to perform the erase operation of the selected memory block.

Figure 2A:
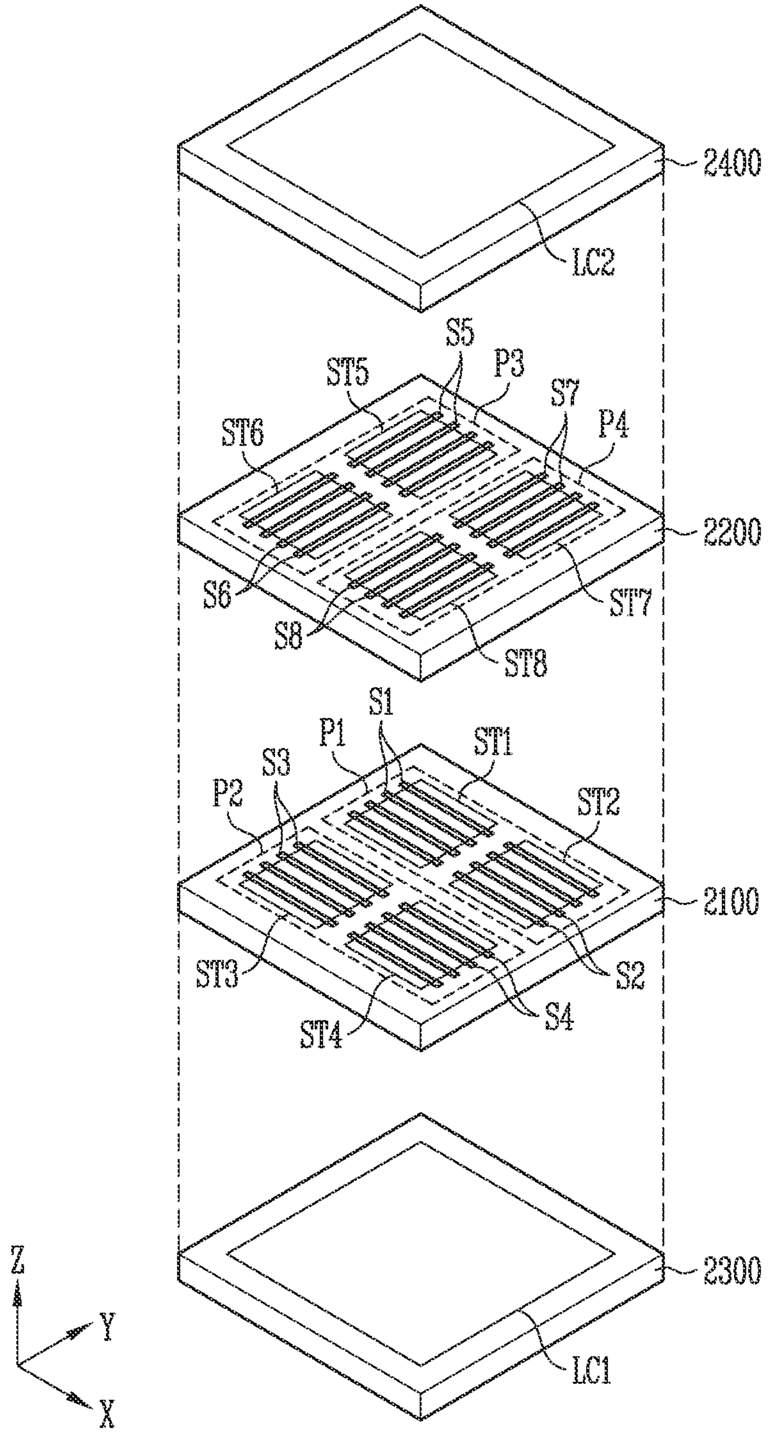
FIGS. 2A and 2B are schematic perspective views illustrating a semiconductor memory device according to an embodiment of the present disclosure.
Figure 2B:
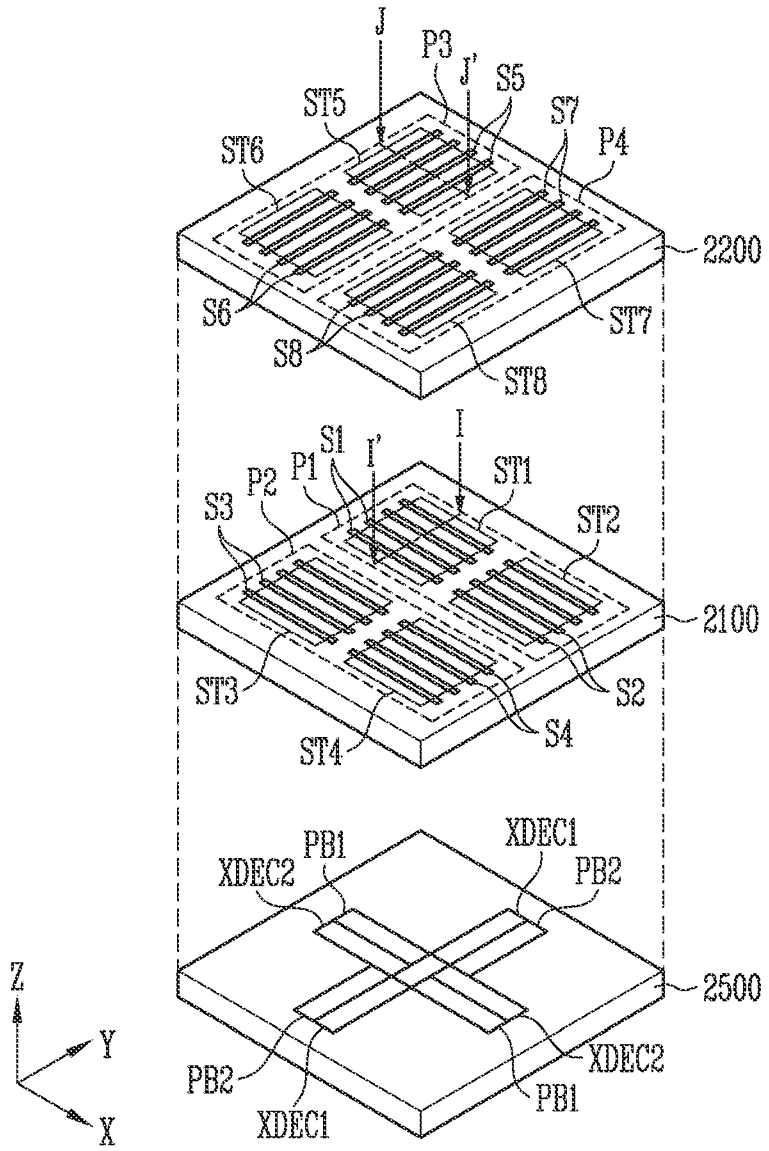

FIGS. 2A and 2B are schematic perspective views illustrating a semiconductor memory device according to an embodiment of the present disclosure.

Referring to FIG. 2A, the semiconductor memory device according to an embodiment of the present disclosure may include a plurality of memory chip structures 2100, 2200, 2300, and 2400. A first memory chip structure 2100 and a second memory chip structure 2200 may be joined in a vertical direction Z.

The first memory chip structure 2100 may include a plurality of plane regions. For example, the first memory chip structure 2100 may include a first plane region P1 and a second plane region P2. In addition, each of the first plane region P1 and the second plane region P2 may include a plurality of stack structures. For example, the first plane region P1 may include a first stack structure ST1 and a second stack structure ST2, and the second plane region P2 may include a third stack structure ST3 and a fourth stack structure ST4. In addition, each of the first plane region P1 and the second plane region P2 may include a plurality of slits that cross and may pass through the stack structures. For example, first slits S1 may extend in a first horizontal direction X perpendicular to the vertical direction Z and may pass through the first stack structure ST1. Second slits S2 may extend in the first horizontal direction X and may pass through the second stack structure ST2. (See also FIG. 6A). Third slits S3 may extend in the first horizontal direction X and may pass through the third stack structure ST3. Fourth slits S4 may extend in the first horizontal direction X and may pass through the fourth stack structure ST4.

In FIG. 2A, the first memory chip structure 2100 includes the first plane region P1 and the second plane region P2, but the embodiment is not limited thereto, and may include one or two or more plane regions.

The second memory chip structure 2200 may overlap on the first memory chip structure 2100 and be bonded to the first memory chip structure 2100. The second memory chip structure 2200 may include a plurality of plane regions. For example, the second memory chip structure 2200 may include a third plane region P3 and a fourth plane region P4. In addition, each of the third plane region P3 and the fourth plane region P4 may include a plurality of stack structures. For example, the third plane region P3 may include a fifth stack structure ST5 and a sixth stack structure ST6, and the fourth plane region P4 may include a seventh stack structure ST7 and an eighth stack structure ST8. In addition, each of the third plane region P3 and the fourth plane region P4 may include a plurality of slits that cross and may pass through the stack structures. For example, Fifth slits S5 may extend in a second horizontal direction Y perpendicular to the vertical direction Z and may pass through the fifth stack structure ST5. The second horizontal direction Y may be perpendicular to the first horizontal direction X. Sixth slits S6 may extend in the second horizontal direction Y and may pass through the sixth stack structure ST6. Seventh slits S7 may extend in the second horizontal direction Y and may pass through the seventh stack structure ST7. Eighth slits S8 may extend in the second horizontal direction Y and may pass through the eighth stack structure ST8.

In FIG. 2A, the second memory chip structure 2200 includes the third plane region P3 and the fourth plane region P4, but the embodiment is not limited thereto and may include one or two or more plane regions.

The above-described first plane region P1, second plane region P2, third plane region P3, and fourth plane region P4 may include a memory cell structure including a plurality of memory cells arranged three-dimensionally.

The first memory chip structure 2100 and the third memory chip structure 2300 may be joined in the vertical direction Z. For example, the third memory chip structure 2300 may overlap under the first memory chip structure 2100 and be bonded to the first memory chip structure 2100. The third memory chip structure 2300 may include a first logic circuit region LC1. The first logic circuit region LC1 may include the peripheral circuit 170 of FIG. 1 for driving the plurality of memory cells included in the first memory chip structure 2100.

The second memory chip structure 2200 and the fourth memory chip structure 2400 may be joined in the vertical direction Z. For example, the fourth memory chip structure 2400 may overlap on the second memory chip structure 2200 and be bonded to the second memory chip structure 2200. The fourth memory chip structure 2400 may include a second logic circuit region LC2. The second logic circuit region LC2 may include the peripheral circuit 170 in FIG. 1 for driving the plurality of memory cells included in the second memory chip structure 2200.

As described above, in an embodiment of the present disclosure, the first and second memory chip structures 2100 and 2200 are bonded in the vertical direction, the plurality of slits S1 to S4 included in the first memory chip structure 2100 extend in the first horizontal direction X, and the plurality of slits S5 to S8 included in the second memory chip structure 2200 extend and are disposed in the second horizontal direction Y which is orthogonal to the first horizontal direction X. Such orientation of the slits is advantageous because a direction of tensile stress or compressive stress occurring in the first memory chip structure 2100 and a direction of tensile stress or compressive stress occurring in the second memory chip structure 2200 are orthogonal to each other to alleviate the stresses. Therefore, a warpage phenomenon that occurs between the first and second memory chip structures 2100 and 2200 may be improved.

Referring to FIG. 2B, a semiconductor memory device according to another embodiment of the present disclosure may include a plurality of memory chip structures 2100, 2200, and 2500. The first and second memory chip structures 2100 and 2200 may be joined in the vertical direction Z.

Since the first and second memory chip structures 2100 and 2200 have structures similar to those of FIG. 2A described above, a detailed description thereof is omitted.

The first memory chip structure 2100 and the fifth memory chip structure 2500 may be joined in the vertical direction Z. For example, the fifth memory chip structure 2500 may overlap under the first memory chip structure 2100 and may be bonded to the first memory chip structure 2100. The fifth memory chip structure 2500 may include a plurality of first page buffer regions PB1, a plurality of second page buffer regions PB2, a plurality of first row decoder regions XDEC1, and a plurality of second row decoder regions XDEC2. The plurality of first page buffer regions PB1 may include the page buffer group 140 of FIG. 1 for driving the plurality of memory cells included in the first memory chip structure 2100, and the plurality of first row decoder region XDEC1 may include the row decoder 130 of FIG. 1 for driving the plurality of memory cells included in the first memory chip structure 2100. The plurality of second page buffer regions PB2 may include the page buffer group 140 of FIG. 1 for driving the plurality of memory cells included in the second memory chip structure 2200, and the plurality of second row decoder regions XDEC2 may include the row decoder 130 of FIG. 1 for driving the plurality of memory cells included in the second memory chip structure 2200.

As described above, in another embodiment of the present disclosure, a peripheral circuit for driving the plurality of memory cells included in a plurality of memory chip structures, that is, the first and second memory chip structures 2100 and 2200 may be included in the fifth memory chip structure 2500. Accordingly, an integration degree of the semiconductor memory device may be improved.

Figure 3:
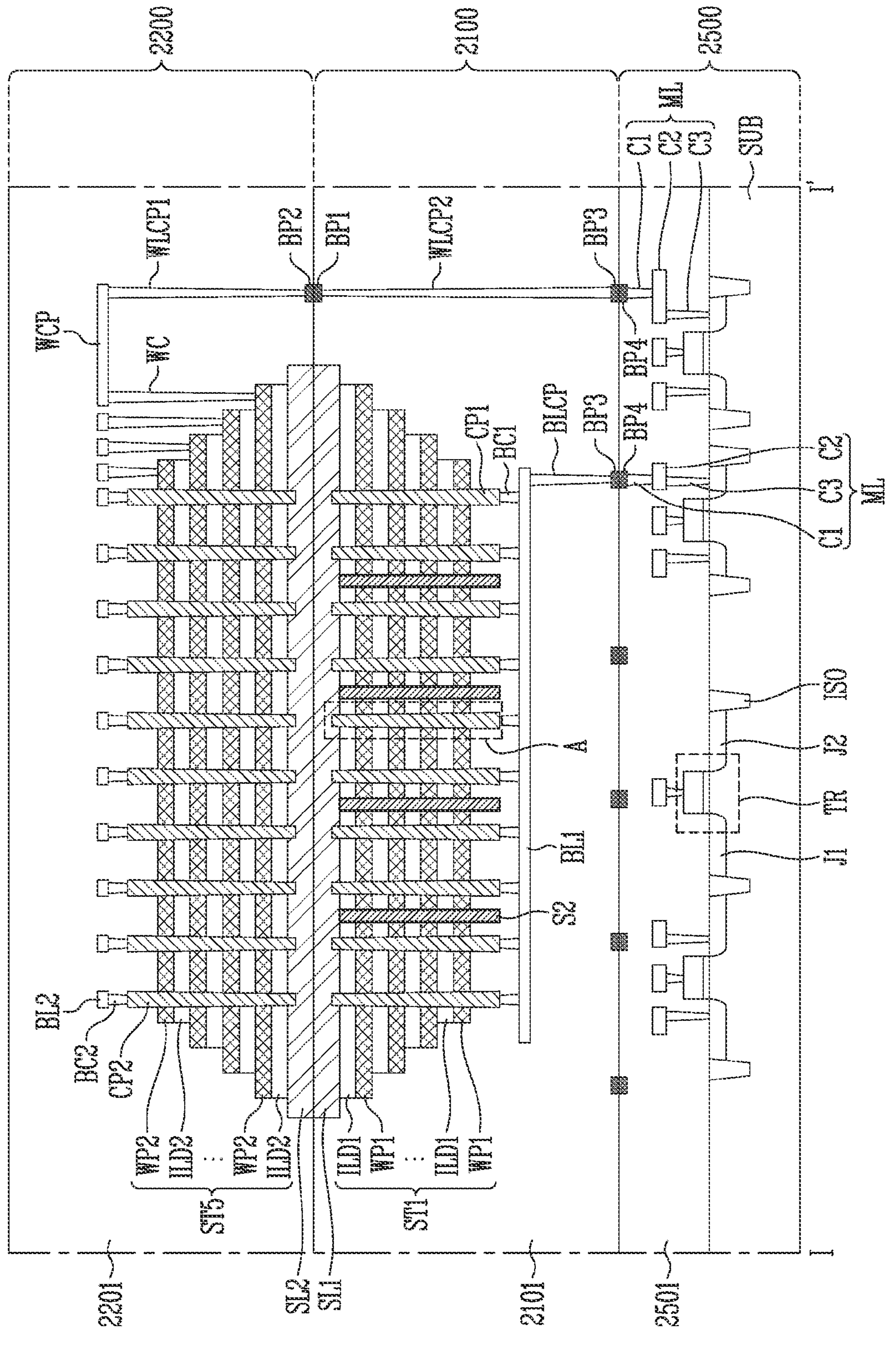
FIG. 3 is a simplified cross-sectional view schematic illustrating a first memory chip structure, a second memory chip structure, and a fifth memory chip structure shown in FIG. 2B according to an embodiment of the present disclosure.

FIG. 3 is a simplified cross-sectional view schematic illustrating the first, second, and fifth memory chip structures shown in FIG. 2B according to an embodiment of the present disclosure.

FIG. 3 is a simplified cross-sectional view schematic illustrating a region taken along a line I-I' of FIG. 2B to describe a semiconductor memory device according to an embodiment of the present disclosure.

Referring to FIG. 3, the semiconductor memory device may include the first, second, and fifth memory chip structures 2100, 2200, and 2500.

The first memory chip structure 2100 may include a first stack structure ST1, a plurality of cell plugs CP1, a plurality of first slits S1, and a first source line layer SL1.

In the first stack structure ST1, a plurality of interlayer insulating layers ILD1 and a plurality of word line patterns WP1 may be alternately stacked. Both ends of the first stack structure ST1 may have a multi-step shape, and an end of each of the plurality of word line patterns WP1 may be exposed by the multi-step shape. The plurality of word line patterns WP1 may extend in a horizontal direction.

The first source line layer SL1 may be disposed on the first stack structure ST1. The first source line layer SL1 may be exposed to a top surface of the first memory chip structure 2100.

Each of the plurality of cell plugs CP1 may extend in the vertical direction within the first stack structure ST1. One end of each of the plurality of cell plugs CP1 may be in direct contact with the first source line layer SL1, and may extend into the first source line layer SL1.

The plurality of first slits S1 may be disposed between the plurality of cell plugs CP1 and may pass through the first stack structure ST1 in the vertical direction. Although not shown in the drawing, the plurality of first slits S1 may extend in the first horizontal direction X as shown in FIG. 2B. That is, the first slits S1 may cross the first stack structure ST1 in the first horizontal direction X and may pass through the first stack structure ST1 in the vertical direction. The first slits S1 may include an insulating material. At least one cell plug CP1 may be disposed between the plurality of first slits S1.

One end of each of the plurality of cell plugs CP1 is connected to a bit line BL1 through a bit line contact BC1. The bit line BL1 may be connected to a bonding pad BP3 exposed through a bottom surface of the first memory chip structure 2100 through a bit line contact plug BLCP.

The first stack structure ST1, the plurality of cell plugs CP1, the plurality of first slits S1, and the first source line layer SL1 may be covered by an interlayer insulating layer 2101.

The second memory chip structure 2200 may be bonded on the first memory chip structure 2100. The second memory chip structure 2200 may be configured by including a fifth stack structure ST5, a plurality of cell plugs CP2, a plurality of fifth slits (not shown), and a second source line layer SL2.

In the fifth stack structure ST5, a plurality of interlayer insulating layers ILD2 and a plurality of word line patterns WP2 may be alternately stacked. Both ends of the fifth stack structure ST5 may have a multi-step shape, and an end of each of the plurality of word line patterns WP2 may be exposed by the multi-step shape. The plurality of word line patterns WP2 may extend in the horizontal direction.

The second source line layer SL2 may be disposed under the fifth stack structure ST5, and the second source line layer SL2 may be exposed to a bottom surface of the second memory chip structure 2200.

Each of the plurality of cell plugs CP2 may extend in the vertical direction within the fifth stack structure ST5. One end of each of the plurality of cell plugs CP2 may be in direct contact with the second source line layer SL2, and may extend into the second source line layer SL2.

The plurality of fifth slits (not shown) may be disposed between the plurality of cell plugs CP2 and may pass through the fifth stack structure ST5 in the vertical direction. Although not shown in the drawing, the plurality of fifth slits may extend in the second horizontal direction Y as shown in FIG. 2B. That is, the fifth slits may cross the fifth stack structure ST5 in the second horizontal direction Y and may pass through the fifth stack structure ST5 in the vertical direction. The fifth slits may include an insulating material.

One end of each of the plurality of word line patterns WP2 may be connected to a bonding pad BP2 through a word line contact WC, a word line wire WCP, and a first word line contact plug WLCP1.

One end of each of the cell plugs CP2 is connected to a bit line BL2 through a bit line contact BC2.

The first source line layer SL1 of the first memory chip structure 2100 and the second source line layer SL2 of the second memory chip structure 2200 may directly contact each other. Accordingly, the cell plugs CP1 of the first memory chip structure 2100 and the cell plugs CP2 of the second memory chip structure 2200 may share the source line layers SL1 and SL2 that are physically and electrically connected.

The fifth stack structure ST5, the plurality of cell plugs CP2, and the second source line layer SL2 may be covered by an interlayer insulating layer 2201.

The bit line contact plug BLCP of the first memory chip structure 2100 may be disposed in one side direction of the first stack structure ST1. For example, the bit line contact plug BLCP corresponding to the first stack structure ST1 may be disposed in a region adjacent to the third stack structure ST3 of FIG. 2B, and may be disposed to overlap with the first page buffer region PB1 of the fifth memory chip structure 2500.

In addition, the first word line contact plug WLCP1 and a second word line contact plug WLCP2 corresponding to the fifth stack structure ST5 of the second memory chip structure 2200 may be disposed adjacent to a region where the bit line contact plug BLCP is disposed, and may be disposed to overlap with the second row decoder region XDEC2 of the fifth memory chip structure 2500.

The first and second memory chip structures 2100 and 2200 may be bonded to each other through a bonding process.

For example, bonding pads BP1 of the top surface of the first memory chip structure 2100 and bonding pads BP2 of the bottom surface of the second memory chip structure 2200 may be disposed to face each other and may be bonded to each other.

The fifth memory chip structure 2500 may be bonded to a lower portion of the first memory chip structure 2100.

The fifth memory chip structure 2500 may be configured by including a plurality of transistors TR, and may further include a plurality of resistors or a plurality of capacitors for configuring the peripheral circuit 170 of FIG. 1.

The fifth memory chip structure 2500 may include a CMOS circuit structure including the plurality of transistors TR formed on a substrate SUB. Each of the plurality of transistors TR may be formed in an active region partitioned by an element isolation layer ISO and may include a gate insulating layer, a gate electrode, and junctions J1 and J2. The plurality of transistors TR may be connected to bonding pads BP4 through a line ML including a plurality of conductive patterns C1 to C3.

The plurality of transistors TR may be covered by an interlayer insulating layer 2501.

The first memory chip structure 2100 and the fifth memory chip structure 2500 may be bonded to each other through a bonding process.

For example, bonding pads BP3 of the bottom surface of the first memory chip structure 2100 and bonding pads BP4 of a top surface of the fifth memory chip structure 2500 may be disposed to face each other and may be bonded to each other.

Figure 4:
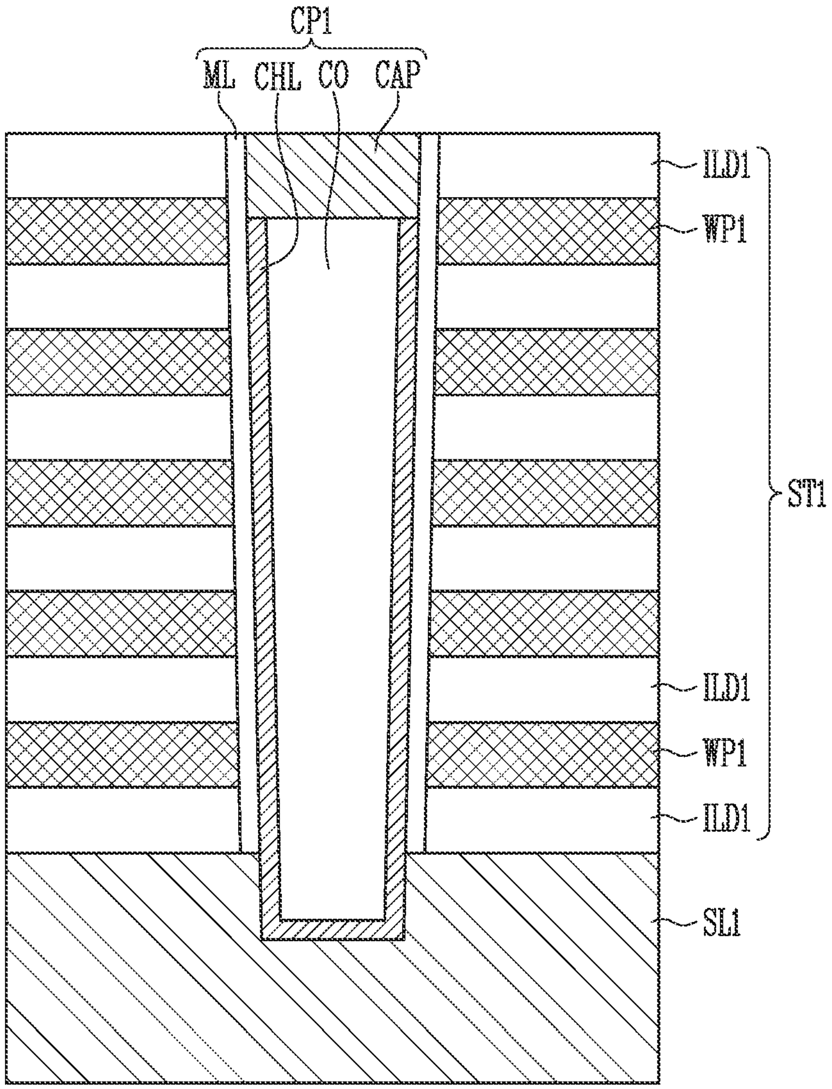
FIG. 4 is a diagram illustrating a region A of FIG. 3.

FIG. 4 is a diagram illustrating a region A of FIG. 3.

Referring to FIG. 4, the cell plug CP1 may extend in the vertical direction by passing through the first stack structure ST1, and one end may extend to the first source line layer SL1.

The cell plug CP1 may include a core insulating layer CO extending in the vertical direction, a channel layer CHL surrounding a sidewall of the core insulating layer CO and also a bottom surface of the core insulating layer CO, a memory layer ML extending along an outer wall of the channel layer CHL, and a capping layer CAP disposed on the core insulating layer CO and the channel layer CHL.

The channel layer CHL of the cell plug CP1 extending into the first source line layer SL1 may be exposed, and thus the first source line layer SL1 and the channel layer CHL may be in direct contact with each other.

The memory layer ML may include a tunnel insulating layer surrounding the channel layer CHL, a data storage layer surrounding the tunnel insulating layer, and a blocking insulating layer surrounding the data storage layer.

Figure 5:
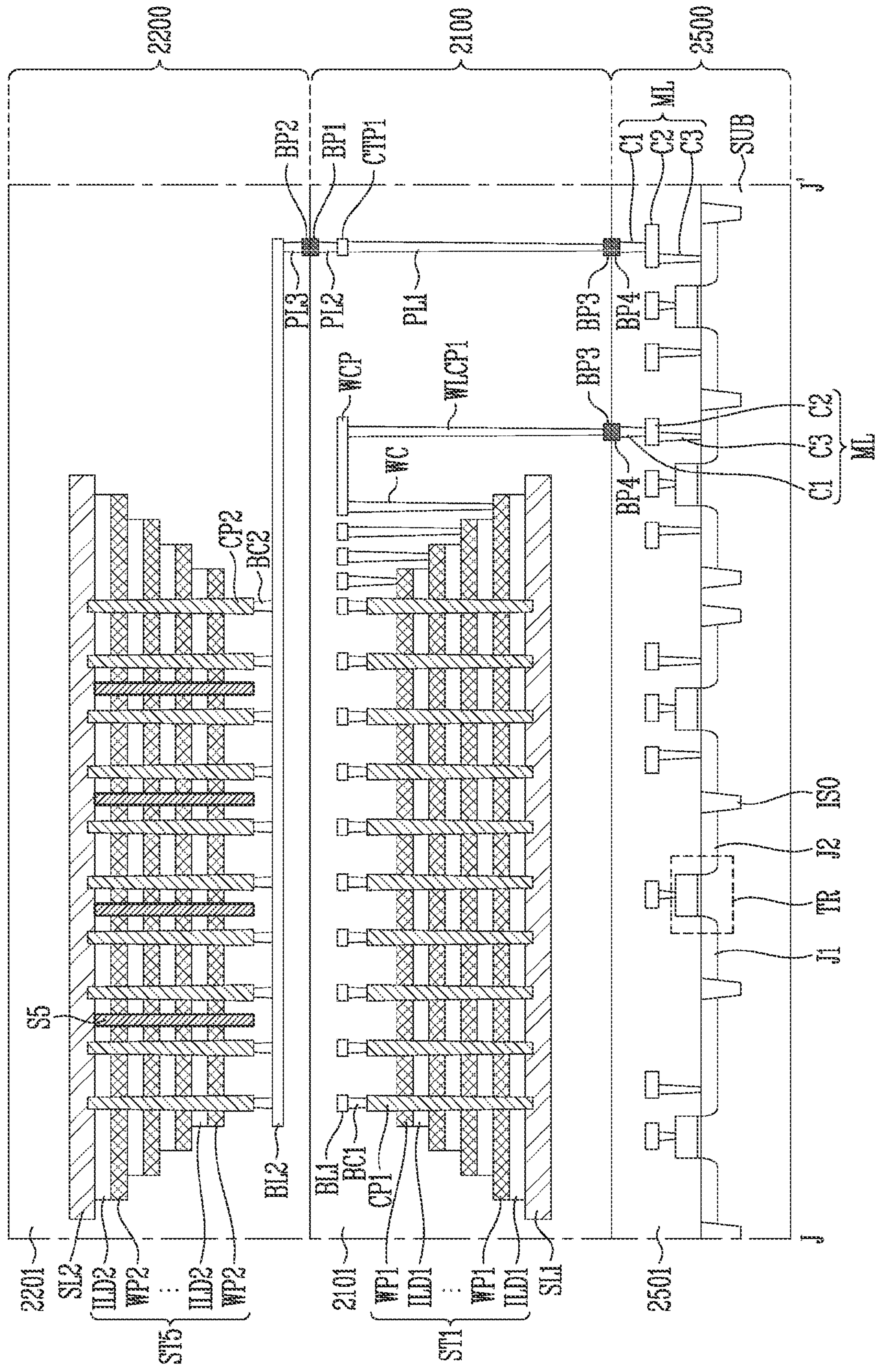
FIG. 5 is a simplified cross-sectional view schematic illustrating the first memory chip structure, the second memory chip structure, and the fifth memory chip structure shown in FIG. 2B according to another embodiment of the present disclosure.

FIG. 5 is a simplified cross-sectional view schematic illustrating the first memory chip structure, the second memory chip structure, and the fifth memory chip structure shown in FIG. 2B according to another embodiment of the present disclosure.

FIG. 5 is a simplified cross-sectional view schematic illustrating a region taken along a line J-J' of FIG. 2B to describe a semiconductor memory device according to another embodiment of the present disclosure.

Referring to FIG. 5, the semiconductor memory device may include the first memory chip structure 2100, the second memory chip structure 2200, and the fifth memory chip structure 2500.

The first memory chip structure 2100 may include a first stack structure ST1, a plurality of cell plugs CP1, a plurality of first slits (not shown), and a first source line layer SL1.

In the first stack structure ST1, a plurality of interlayer insulating layers ILD1 and a plurality of word line patterns WP1 may be alternately stacked. Both ends of the first stack structure ST1 may have a multi-step shape, and an end of each of the plurality of word line patterns WP1 may be exposed by the multi-step shape. The plurality of word line patterns WP1 may extend in a horizontal direction.

The first source line layer SL1 may be disposed under the first stack structure ST1.

Each of the plurality of cell plugs CP1 may extend in the vertical direction within the first stack structure ST1. One end of each of the plurality of cell plugs CP1 may be in direct contact with the first source line layer SL1, and may extend into the first source line layer SL1.

The plurality of first slits (not shown) may be disposed between the plurality of cell plugs CP1 and may pass through the first stack structure ST1 in the vertical direction. Although not shown in the drawing, the plurality of first slits may extend in the first horizontal direction X as shown in FIG. 2B. That is, the first slits may cross the first stack structure ST1 in the first horizontal direction X and may pass through the first stack structure ST1 in the vertical direction. The first slits may include an insulating material. At least one cell plug CP1 may be disposed between the plurality of first slits.

One end of each of the plurality of cell plugs CP1 is connected to a bit line BL1 through a bit line contact BC1. The bit line BL1 may be connected to a bonding pad BP3 exposed through the bottom surface of the first memory chip structure 2100 through a bit line contact plug BLCP. In addition, the bit line BL1 may be connected to the bonding pad BP1 exposed through the top surface of the first memory chip structure 2100.

The first memory chip structure 2100 may further include plug lines (not shown) and a contact plug (not shown) passing through the first memory chip structure 2100.

The first stack structure ST1, the plurality of cell plugs CP1, the plurality of first slits, and the first source line layer SL1 may be covered by an interlayer insulating layer 2101.

The second memory chip structure 2200 may be bonded on the first memory chip structure 2100. The second memory chip structure 2200 may be configured by including a fifth stack structure ST5, a plurality of cell plugs CP2, a plurality of fifth slits S5, and a second source line layer SL2.

In the fifth stack structure ST5, a plurality of interlayer insulating layers ILD2 and a plurality of word line patterns WP2 may be alternately stacked. Both ends of the fifth stack structure ST5 may have a multi-step shape, and an end of each of the plurality of word line patterns WP2 may be exposed by the multi-step shape. The plurality of word line patterns WP2 may extend in the horizontal direction.

The second source line layer SL2 may be disposed on the fifth stack structure ST5.

Each of the plurality of cell plugs CP2 may extend in the vertical direction within the fifth stack structure ST5. One end of each of the plurality of cell plugs CP2 may be in direct contact with the second source line layer SL2, and may extend into the second source line layer SL2.

The plurality of fifth slits S5 may be disposed between the plurality of cell plugs CP2, with one fifth slit S5 between each pair of adjacent cell plugs CP2. The fifth slits S5 may each pass through the fifth stack structure ST5 in the vertical direction. Although not shown in the drawing, the plurality of fifth slits S5 may extend in the second horizontal direction Y as shown in FIG. 2B. That is, the fifth slits S5 may cross the fifth stack structure ST5 in the second horizontal direction Y and may pass through the fifth stack structure ST5 in the vertical direction. The fifth slits S5 may include an insulating material.

One end of each of the plurality of word line patterns WP1 may be connected to a bonding pad BP3 through a word line contact WC, a word line wire WCP, and a first word line contact plug WLCP1.

One end of each of the cell plugs CP2 is connected to a bit line BL2 through a bit line contact BC2. The bit line BL2 may be connected to a bonding pad BP2 exposed through the bottom surface of the second memory chip structure 2200 through a bit line contact plug PL3.

The first memory chip structure 2100 may further include bit line contact plugs PL1 and PL2 and a contact plug CTP1 electrically connected to the bit line contact plug PL3 of the second memory chip structure 2200.

The fifth stack structure ST5, the plurality of cell plugs CP2, and the second source line layer SL2 may be covered by an interlayer insulating layer 2201.

The first word line contact plug WLCP1 of the first memory chip structure 2100 may be disposed in one side direction of the first stack structure ST1. For example, the first word line contact plug WLCP1 corresponding to the first stack structure ST1 may be disposed in a region adjacent to the second stack structure ST2 of FIG. 2B, and may be disposed to overlap with the first row decoder region XDEC1 of the fifth memory chip structure 2500. In addition, the bit line contact plugs PL1, PL2, and PL3 corresponding to the fifth stack structure ST5 may be disposed adjacent to a region where the first word line contact plug WLCP1 is disposed, and may be disposed to overlap with the second page buffer region PB2 of the fifth memory chip structure 2500.

The first and second memory chip structures 2100 and 2200 may be bonded to each other through a bonding process.

For example, bonding pads BP1 of the top surface of the first memory chip structure 2100 and bonding pads BP2 of the bottom surface of the second memory chip structure 2200 may be disposed to face each other and may be bonded to each other.

The fifth memory chip structure 2500 may be bonded to a lower portion of the first memory chip structure 2100.

The fifth memory chip structure 2500 may be configured by including a plurality of transistors TR, and may further include a plurality of resistors or a plurality of capacitors for configuring the peripheral circuit 170 of FIG. 1.

The fifth memory chip structure 2500 may include a CMOS circuit structure including the plurality of transistors TR formed on a substrate SUB. Each of the plurality of transistors TR may be formed in an active region partitioned by an element isolation layer ISO and may include a gate insulating layer, a gate electrode, and junctions J1 and J2. The plurality of transistors TR may be connected to bonding pads BP4 through a line ML including a plurality of conductive patterns C1 to C3.

The plurality of transistors TR may be covered by an interlayer insulating layer 2501.

The first memory chip structure 2100 and the fifth memory chip structure 2500 may be bonded to each other through a bonding process.

For example, bonding pads BP3 of the bottom surface of the first memory chip structure 2100 and bonding pads BP4 of a top surface of the fifth memory chip structure 2500 may be disposed to face each other and may be bonded to each other.

Figure 6A:
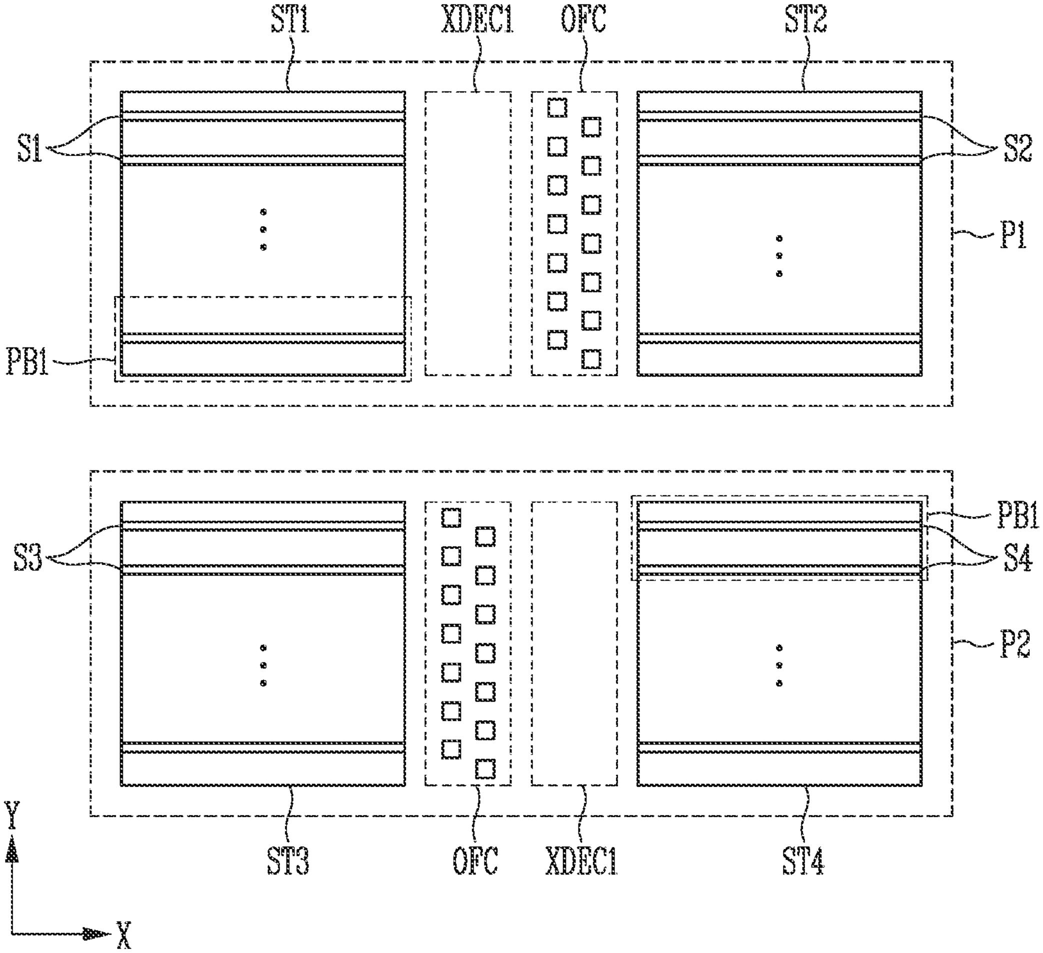
FIGS. 6A, 6B, and 6C are diagrams illustrating an overlapping region of a first memory chip structure, a second memory chip structure, and a fifth memory chip structure according to an embodiment of the present disclosure.
Figure 6B:
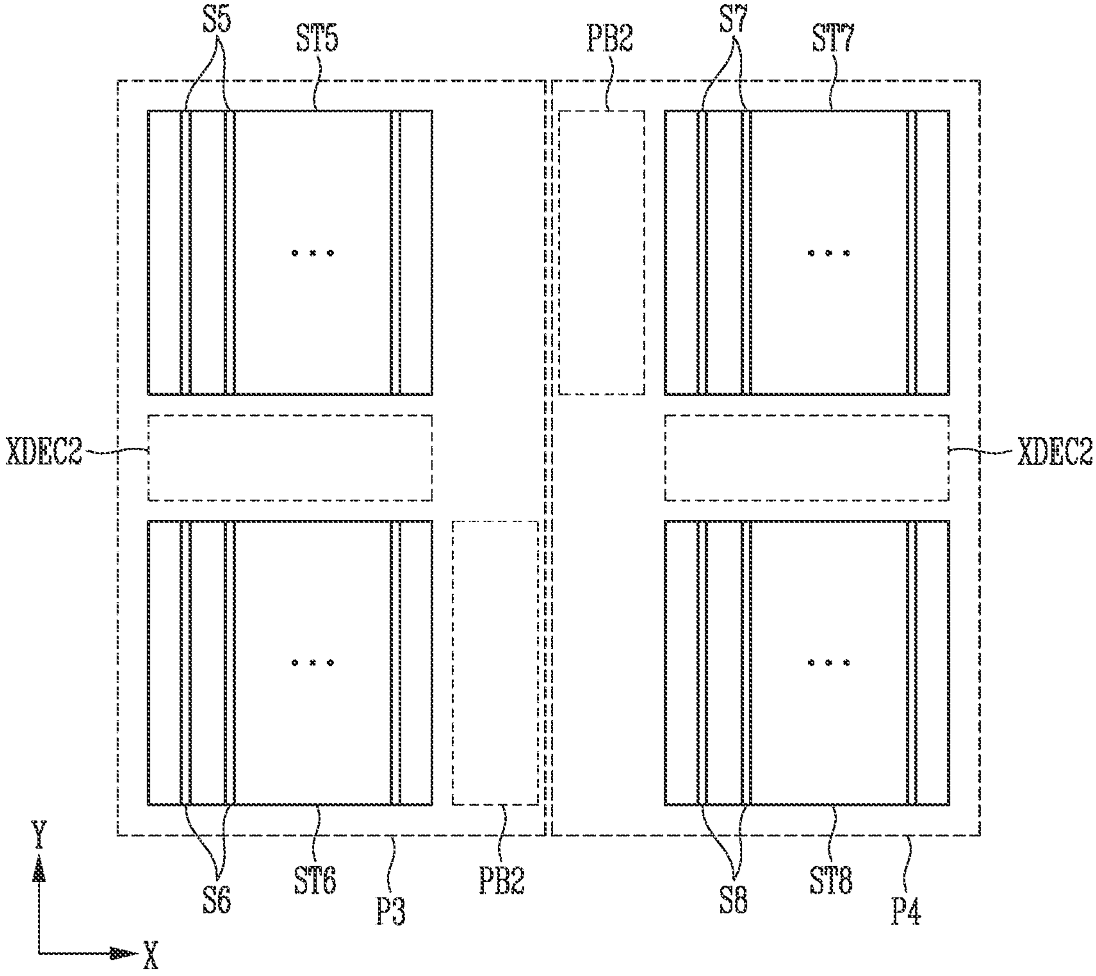
Figure 6C:
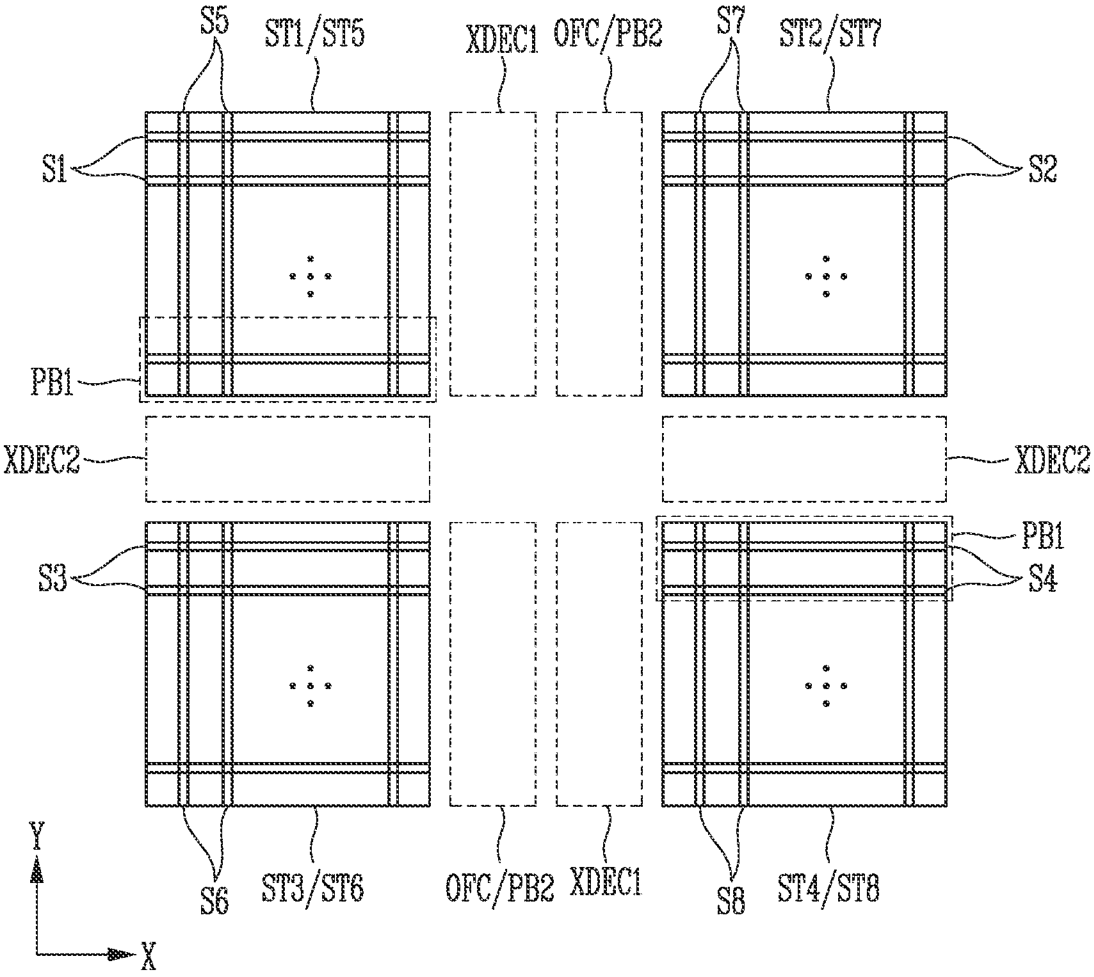

FIGS. 6A, 6B, and 6C are diagrams illustrating an overlapping region of a first memory chip structure, a second memory chip structure, and a fifth memory chip structure according to an embodiment of the present disclosure.

FIG. 6A is a diagram illustrating an overlapping region of the first and fifth memory chip structures.

Referring to FIG. 6A, the first plane region P1 of the first memory chip structure may include the first and second stack structures ST1 and ST2 disposed adjacent to each other side by side in the first horizontal direction X. The first and second stack structures ST1 and ST2 may be spaced apart from each other by a certain distance. In addition, the second plane region P2 of the first memory chip structure may include the third and fourth stack structures ST3 and ST4 disposed adjacent to each other side by side in the first horizontal direction X, and the third and fourth stack structures ST3 and ST4 may be spaced apart from each other by a certain distance. The first to fourth stack structures ST1 to ST4 may be arranged in a matrix form.

The first slits S1 may extend in the first horizontal direction X perpendicular to the vertical direction Z and may pass through the first stack structure ST1. The second slits S2 may extend in the first horizontal direction X and may pass through the second stack structure ST2. The third slits S3 may extend in the first horizontal direction X and may pass through the third stack structure ST3. The fourth slits S4 may extend in the first horizontal direction X and may pass through the fourth stack structure ST4.

The first page buffer region PB1 of the fifth memory chip structure may overlap with the first stack structure ST1 and the fourth stack structure ST4. For example, the first page buffer region PB1 of the fifth memory chip structure may be disposed under the first stack structure ST1 adjacent to the third stack structure ST3, and the first page buffer region PB1 of the fifth memory chip structure may be disposed under the fourth stack structure ST4 adjacent to the second stack structure ST2. The first page buffer region PB1 of the fifth memory chip structure may be a region where page buffers connected to bit lines of the memory cells included in the first memory chip structure are disposed.

The first row decoder region XDEC1 of the fifth memory chip structure may overlap with a region between the first and second stack structures ST1 and ST2, and the first row decoder region XDEC1 of the fifth memory chip structure may overlap with a region between the third and fourth stack structures ST3 and ST4. The first row decoder region XDEC1 of the fifth memory chip structure may be a region where a row decoder connected to word lines of the memory cells included in the first memory chip structure is disposed.

A partial region that does not overlap with the first row decoder region XDEC1 in the region between the first and second stack structures ST1 and ST2 of the first memory chip structure may be defined as an OFC region OFC, the OFC region OFC may be a region where the first stack structure ST1 and lines connected to the bit lines connected to the cell plugs disposed in the first stack structure ST1 extend to the lower fifth memory chip structure.

In addition, a partial region that does not overlap with the first row decoder region XDEC1 in a region between the third and fourth stack structures ST3 and ST4 of the first memory chip structure may be defined as the OFC region, and the OFC region OFC may be a region where lines connected to bit lines connected to cell plugs disposed in the third and fourth stack structures ST3 and ST4 extend to the lower fifth memory chip structure.

FIG. 6B is a diagram illustrating an overlapping region of the second memory chip structure and the fifth memory chip structure.

Referring to FIG. 6B, the third plane region P3 of the second memory chip structure may include the fifth and sixth stack structures ST5 and ST6 disposed adjacent to each other side by side in the second horizontal direction Y. The fifth and sixth stack structures ST5 and ST6 may be spaced apart from each other by a certain distance. In addition, the fourth plane region P4 of the second memory chip structure may include the seventh and eight stack structures ST7 and ST8 disposed adjacent to each other side by side in the second horizontal direction Y. The seventh and eight stack structures ST7 and ST8 may be spaced apart by a certain distance. The fifth to eighth stack structures ST5 to ST8 may be arranged in a matrix form.

The fifth slits S5 may extend in the second horizontal direction Y perpendicular to the vertical direction Z and may pass through the fifth stack structure ST5. The sixth slits S6 may extend in the second horizontal direction Y and may pass through the sixth stack structure ST6. The seventh slits S7 may extend in the second horizontal direction Y and may pass through the seventh stack structure ST7. The eighth slits S8 may extend in the second horizontal direction Y and may pass through the eighth stack structure ST8.

The second page buffer region PB2 of the fifth memory chip structure may overlap with a region between the fifth and seventh stack structures ST5 and ST7. In addition, the second page buffer region PB2 of the fifth memory chip structure may overlap with the OFC region between the first stack structure ST1 and the second stack structure ST2 of FIG. 6A. In addition, the second page buffer region PB2 of the fifth memory chip structure may overlap with a region between the sixth stack structure ST6 and the eighth stack structure ST8. In addition, the second page buffer region PB2 of the fifth memory chip structure may overlap with the OFC region between the third and fourth stack structures ST3 and ST4 of FIG. 6A. The second page buffer region PB2 may be a region where page buffers connected to bit lines of the memory cells included in the second memory chip structure are disposed.

The second row decoder region XDEC2 of the fifth memory chip structure may overlap with a region between the fifth and sixth stack structures ST5 and ST6 and a region between the seventh and eight stack structures ST7 and ST8. The second row decoder region XDEC2 of the fifth memory chip structure may be a region where a row decoder connected to word lines of the memory cells included in the second memory chip structure is disposed.

FIG. 6C is a diagram illustrating an overlapping region of the first memory chip structure, the second memory chip structure, and the fifth memory chip structure.

Referring to FIG. 6C, the first stack structure ST1 of the first memory chip structure and the fifth stack structure ST5 of the second memory chip structure may overlap with each other, the second stack structure ST2 of the first memory chip structure and the seventh stack structure ST7 of the second memory chip structure may overlap with each other, the third stack structure ST3 of the first memory chip structure and the sixth stack structure ST6 of the second memory chip structure may overlap with each other, and the fourth stack structure ST4 of the first memory chip structure and the eighth stack structure ST8 of the second memory chip structure may overlap with each other.

In addition, an extension direction of the first slit S1 and an extension direction of the fifth slit S5 may be orthogonal to each other, an extension direction of the second slit S2 and an extension direction of the seventh slit S7 may be orthogonal to each other, an extension direction of the third slit S3 and an extension direction of the sixth slit S6 may be orthogonal to each other, and an extension direction of the fourth slit S4 and an extension direction of the eighth slit S8 may be orthogonal to each other.

A region between the first stack structure ST1 and the second stack structure ST2 may overlap with the first row decoder region XDEC1 and the second page buffer region PB2 of the fifth memory chip structure, and the second page buffer region PB2 among these may overlap with the OFC region OFC of the second memory chip structure.

A region between the third and fourth stack structures ST3 and ST4 may overlap with the first row decoder region XDEC1 and the second page buffer region PB2 of the fifth memory chip structure, and the second page buffer region PB2 among these may overlap with the OFC region OFC of the second memory chip structure.

The first row decoder region XDEC1 may be disposed adjacent to the second page buffer region PB2.

A region between the first stack structure ST1 and the third stack structure ST3 may overlap with the second row decoder region XDEC2 of the fifth memory chip structure, and the first page buffer region PB1 may overlap with the first stack structure ST1 and the fifth stack structure ST5.

A region between the second stack structure ST2 and the fourth stack structure ST4 may overlap with the second row decoder region XDEC2 of the fifth memory chip structure, and the first page buffer region PB1 may overlap with the fourth stack structure ST4 and the eighth stack structure ST8.

As shown in FIG. 3, a plurality of first source line layers respectively corresponding to the first to fourth stack structures ST1 to ST4 may be exposed on the top surface of the first memory chip structure.

As shown in FIG. 3, a plurality of second source line layers respectively corresponding to the fifth to eighth stack structures ST5 to ST8 may be exposed on the bottom surface of the second memory chip structure, and the plurality of first source line layers and the plurality of second source line layers may be in direct contact.

Figure 7A:
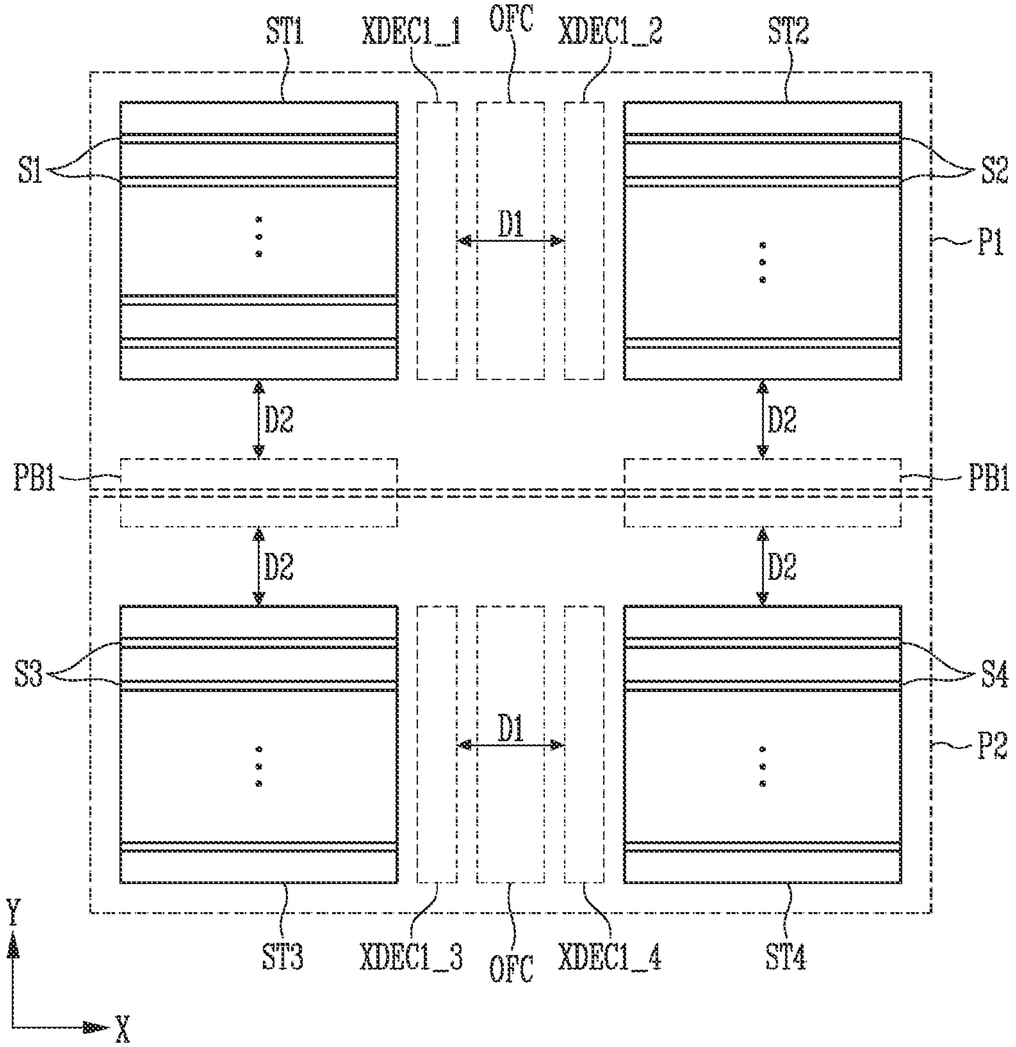
FIGS. 7A, 7B, and 7C are diagrams illustrating an overlapping region of a first memory chip structure, a second memory chip structure, and a fifth memory chip structure according to another embodiment of the present disclosure.
Figure 7B:
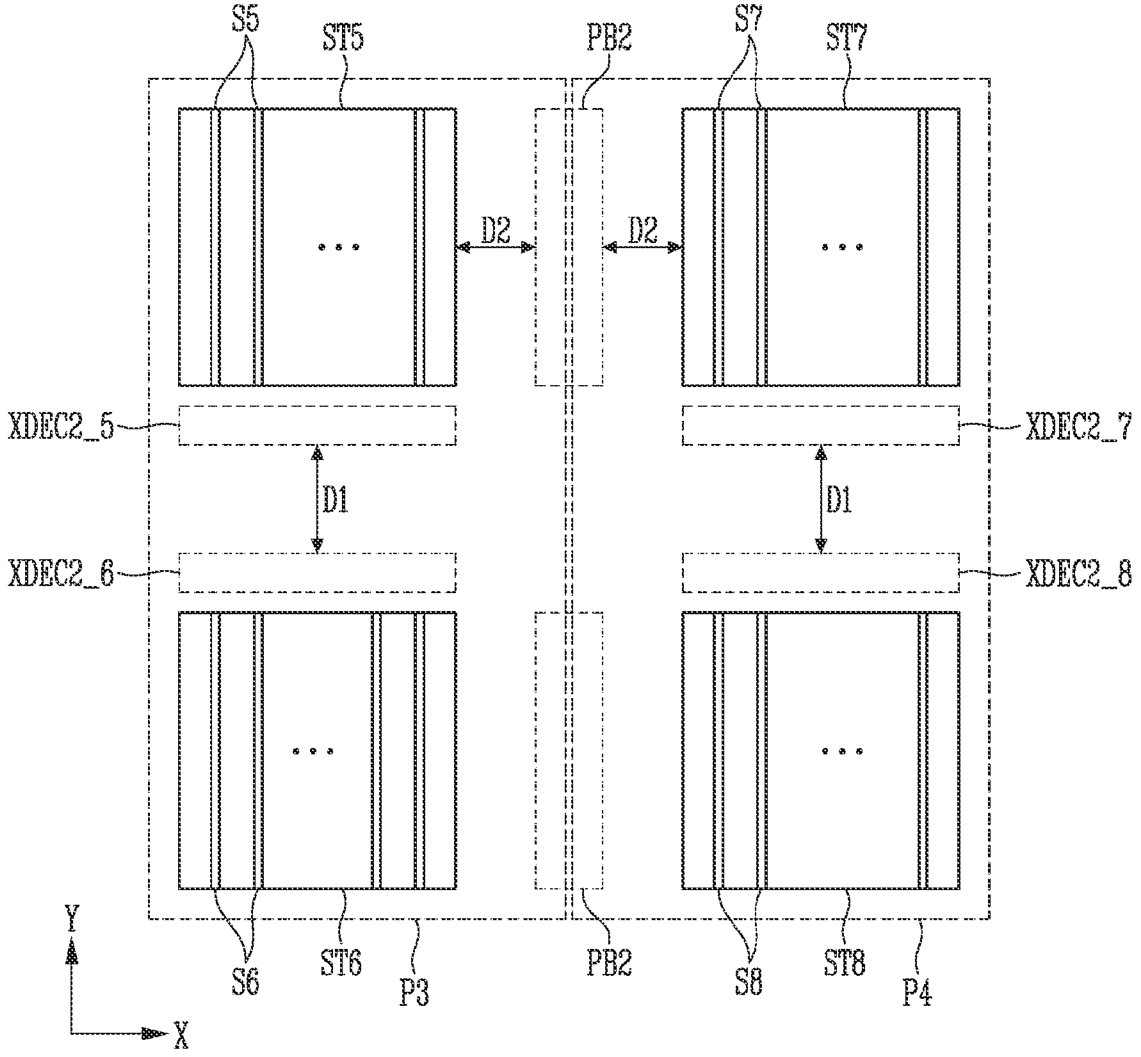
Figure 7C:
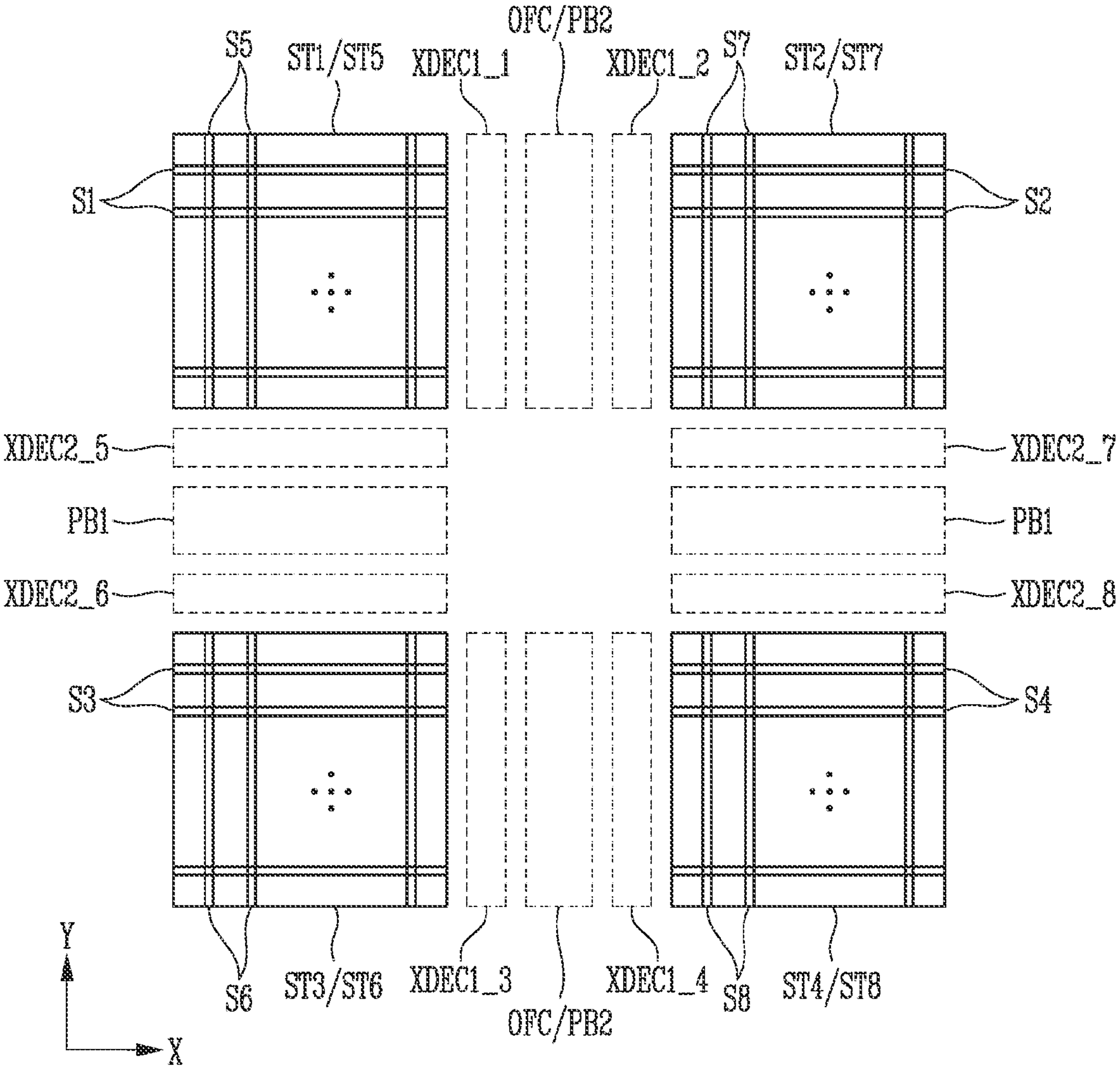

FIGS. 7A, 7B, and 7C are diagrams illustrating an overlapping region of a first memory chip structure, a second memory chip structure, and a fifth memory chip structure according to another embodiment of the present disclosure.

FIG. 7A is a diagram illustrating an overlapping region of the first and fifth memory chip structures.

Referring to FIG. 7A, the first plane region P1 of the first memory chip structure may include the first and second stack structures ST1 and ST2 disposed adjacent to each other side by side in the first horizontal direction X, and the first and second stack structures ST1 and ST2 may be spaced apart from each other by a certain distance. In addition, the second plane region P2 of the first memory chip structure may include the third and fourth stack structures ST3 and ST4 disposed adjacent to each other side by side in the first horizontal direction X, and the third and fourth stack structures ST3 and ST4 may be spaced apart from each other by a certain distance. The first to fourth stack structures ST1 to ST4 may be arranged in a matrix form.

The first slits S1 may extend in the first horizontal direction X perpendicular to the vertical direction Z and may pass through the first stack structure ST1. The second slits S2 may extend in the first horizontal direction X and may pass through the second stack structure ST2. The third slits S3 may extend in the first horizontal direction X and may pass through the third stack structure ST3. The fourth slits S4 may extend in the first horizontal direction X and may pass through the fourth stack structure ST4.

A first row decoder region XDEC1_1 and the second row decoder region XDEC1_2 of the fifth memory chip structure may overlap with the region between the first and second stack structures ST1 and ST2. The first row decoder region XDEC1_1 and the second row decoder region XDEC1_2 may be spaced apart by a first distance D1, and a region of the first memory chip structure overlapping a region between the first row decoder region XDEC1_1 and the second row decoder region XDEC1_2 may be defined as the OFC region. The first row decoder region XDEC1_1 may be a region where a row decoder connected to the word lines of the memory cells formed in the first stack structure ST1 is disposed. The second row decoder region XDEC1_2 may be a region where a row decoder connected to the word lines of the memory cells formed in the second stack structure ST2 is disposed. The OFC region OFC may be a region where lines connected to the bit lines connected to the cell plugs disposed in the first and second stack structures ST1 and ST2 extend to the lower fifth memory chip structure.

A third row decoder region XDEC1_3 and a fourth row decoder region XDEC1_4 of the fifth memory chip structure may overlap with the region between the third and fourth stack structures ST3 and ST4. The third row decoder region XDEC1_3 and the fourth row decoder region XDEC1_4 may be spaced apart by the first distance D1, and a region of the first memory chip structure overlapping a region between the third row decoder region XDEC1_3 and the fourth row decoder region XDEC1_4 may be defined as the OFC region. The third row decoder region XDEC1_3 may be a region where a row decoder connected to word lines of memory cells formed in the third stack structure ST3 is disposed. The fourth row decoder region XDEC1_4 may be a region where a row decoder connected to word lines of memory cells formed in the fourth stack structure ST4 is disposed. The OFC region OFC may be a region where lines connected to bit lines connected to cell plugs disposed in the third and fourth stack structures ST3 and ST4 extend to the lower fifth memory chip structure.

The first page buffer region PB1 of the fifth memory chip structure may overlap with the region between the first stack structure ST1 and the third stack structure ST3 and the region between the second stack structure ST2 and the fourth stack structure ST4. The first page buffer region PB1 may be spaced apart from a region overlapping each of the first to fourth stack structures ST1 to ST4 by a second distance D2. The first page buffer region PB1 of the fifth memory chip structure may be a region where the page buffers connected to the bit lines of the memory cells included in the first memory chip structure are disposed.

FIG. 7B is a diagram illustrating an overlapping region of the second memory chip structure and the fifth memory chip structure.

Referring to FIG. 7B, the third plane region P3 of the second memory chip structure may include the fifth and sixth stack structures ST5 and ST6 disposed adjacent to each other side by side in the second horizontal direction Y. The fifth and sixth stack structures ST5 and ST6 may be spaced apart from each other by a certain distance. In addition, the fourth plane region P4 of the second memory chip structure may include the seventh and eight stack structures ST7 and ST8 disposed adjacent to each other side by side in the second horizontal direction Y, and the seventh and eight stack structures ST7 and ST8 may be spaced apart by a certain distance. The fifth to eighth stack structures ST5 to ST8 may be arranged in a matrix form.

The fifth slits S5 may extend in the second horizontal direction Y perpendicular to the vertical direction Z and may pass through the fifth stack structure ST5. The sixth slits S6 may extend in the second horizontal direction Y and may pass through the sixth stack structure ST6. The seventh slits S7 may extend in the second horizontal direction Y and may pass through the seventh stack structure ST7. The eighth slits S8 may extend in the second horizontal direction Y and may pass through the eighth stack structure ST8.

The second page buffer region PB2 of the fifth memory chip structure may overlap with a region between the fifth stack structure ST5 and the seventh stack structure ST7 and a region between the sixth stack structure ST6 and the eighth stack structure ST8. The second page buffer region PB2 may be spaced apart from a region overlapping each of the fifth to eighth stack structures ST5 to ST8 by a second distance D2. The second page buffer region PB2 may be a region where the page buffers connected to the bit lines of the memory cells included in the second memory chip structure are disposed.

A fifth row decoder region XDEC2_5 and a sixth row decoder region XDEC2_6 of the fifth memory chip structure may overlap with a region between the fifth and sixth stack structures ST5 and ST6. The fifth row decoder region XDEC2_5 and the sixth row decoder region XDEC2_6 may be spaced apart by the first distance D1. The fifth row decoder region XDEC2_5 may be a region where a row decoder connected to word lines of memory cells formed in the fifth stack structure ST5 is disposed. The sixth row decoder region XDEC2_6 may be a region where a row decoder connected to word lines of memory cells formed in the sixth stack structure ST6 is disposed.

A seventh row decoder region XDEC2_7 and an eighth row decoder region XDEC2_8 of the fifth memory chip structure may overlap with a region between the seventh and eight stack structures ST7 and ST8. The seventh row decoder region XDEC2_7 and the eighth row decoder region XDEC2_8 may be spaced apart by the first distance D1. The seventh row decoder region XDEC2_7 may be a region where a row decoder connected to word lines of memory cells formed in the seventh stack structure ST7 is disposed. The eighth row decoder region XDEC2_8 may be a region where a row decoder connected to word lines of memory cells formed in the eighth stack structure ST8 is disposed.

FIG. 7C is a diagram illustrating an overlapping region of the first memory chip structure, the second memory chip structure, and the fifth memory chip structure.

Referring to FIG. 7C, the first stack structure ST1 of the first memory chip structure and the fifth stack structure ST5 of the second memory chip structure may overlap with each other, the second stack structure ST2 of the first memory chip structure and the seventh stack structure ST7 of the second memory chip structure may overlap with each other, the third stack structure ST3 of the first memory chip structure and the sixth stack structure ST6 of the second memory chip structure may overlap with each other, and the fourth stack structure ST4 of the first memory chip structure and the eighth stack structure ST8 of the second memory chip structure may overlap with each other.

In addition, an extension direction of the first slit S1 and an extension direction of the fifth slit S5 may be orthogonal to each other, an extension direction of the second slit S2 and an extension direction of the seventh slit S7 may be orthogonal to each other, an extension direction of the third slit S3 and an extension direction of the sixth slit S6 may be orthogonal to each other, and an extension directions of the fourth slit S4 and an extension direction of the eighth slit S8 may be orthogonal to each other.

A region between the first and second stack structures ST1 and ST2 may overlap with the first row decoder region XDEC1_1, the second page buffer region PB2, and the second row decoder region XDEC1_2 of the fifth memory chip structure, and the second page buffer region PB2 among these may overlap with the OFC region OFC of the second memory chip structure.

A region between the third and fourth stack structures ST3 and ST4 may overlap with the third row decoder region XDEC1_3, the second page buffer region PB2, and the fourth row decoder region XDEC1_4 of the fifth memory chip structure, and the second page buffer region PB2 among these may overlap with the OFC region OFC of the second memory chip structure.

A region between the first stack structure ST1 and the third stack structure ST3 may overlap with the fifth row decoder region XDEC2_5, the first page buffer region PB1, and the sixth row decoder region XDEC2_6 of the fifth memory chip structure.

A region between the second stack structure ST2 and the fourth stack structure ST4 may overlap with the seventh row decoder region XDEC2_7, the first page buffer region PB1, and the eighth row decoder region XDEC2_8 of the fifth memory chip structure.

As shown in FIG. 3, a plurality of first source line layers respectively corresponding to the first to fourth stack structures ST1 to ST4 may be exposed on the top surface of the first memory chip structure.

As shown in FIG. 3, a plurality of second source line layers respectively corresponding to the fifth to eighth stack structures ST5 to ST8 may be exposed on the bottom surface of the second memory chip structure, and the plurality of first source line layers and the plurality of second source line layers may be in direct contact.

Figure 8A:
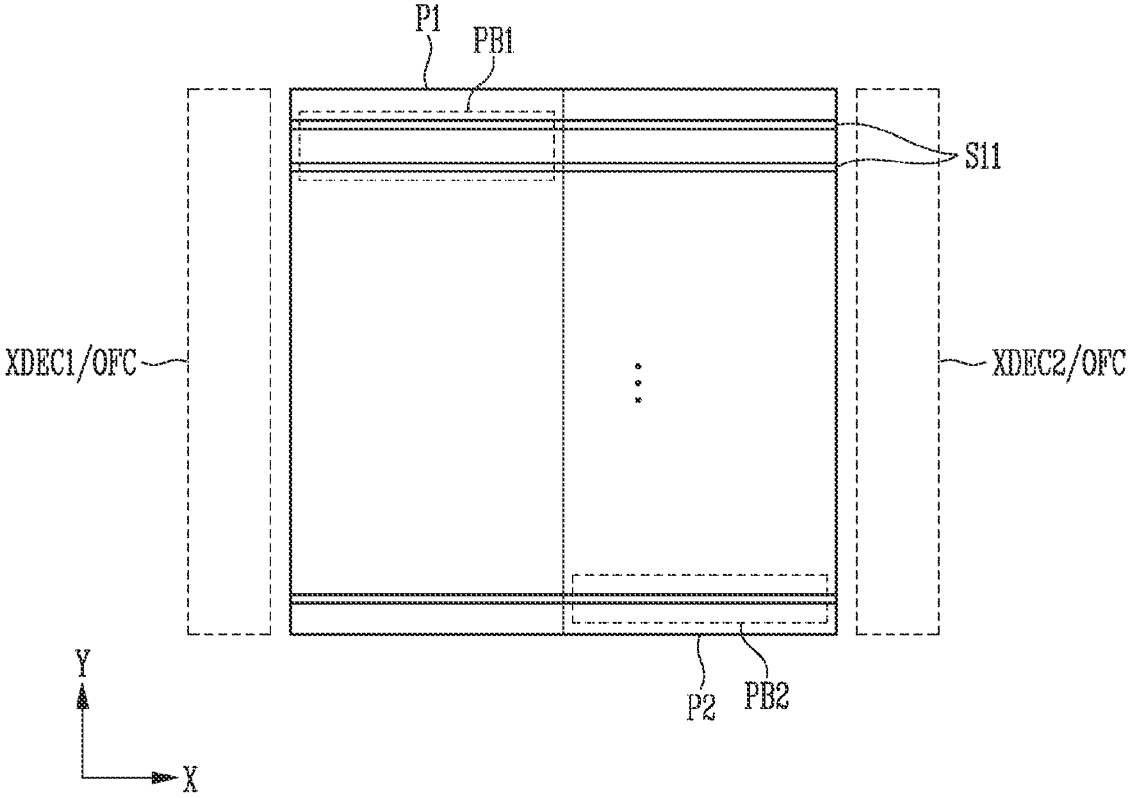
FIGS. 8A, 8B, and 8C are diagrams illustrating an overlapping region of a first memory chip structure, a second memory chip structure, and a fifth memory chip structure according to still another embodiment of the present disclosure.
Figure 8B:
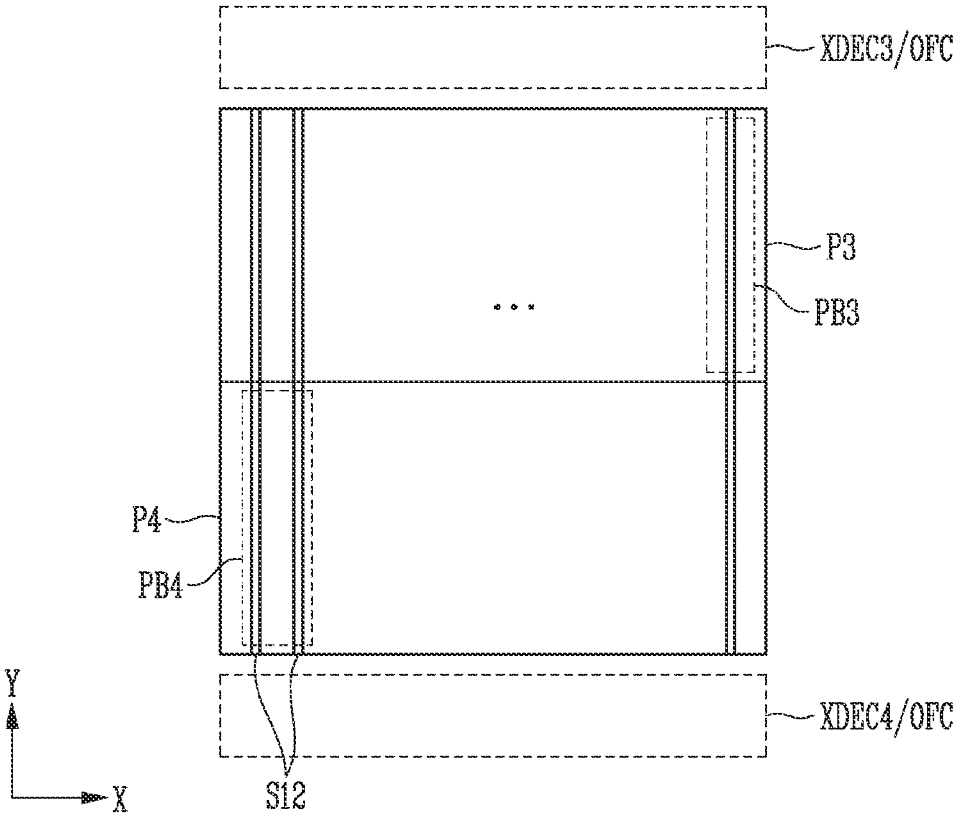
Figure 8C:
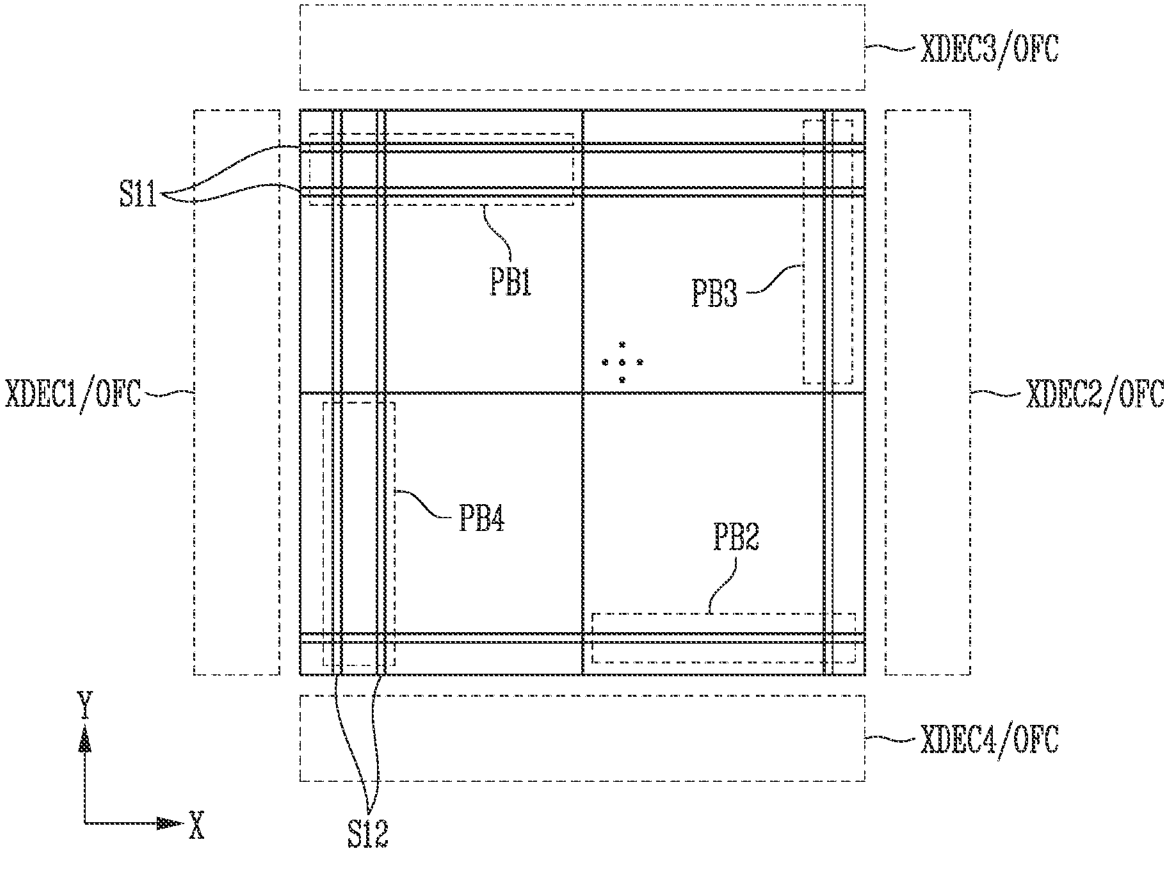

FIGS. 8A, 8B, and 8C are diagrams illustrating an overlapping region of a first memory chip structure, a second memory chip structure, and a fifth memory chip structure according to still another embodiment of the present disclosure.

FIG. 8A is a diagram illustrating an overlapping region of the first and fifth memory chip structures.

Referring to FIG. 8A, the first plane region P1 and the second plane region P2 of the first memory chip structure may be disposed adjacent to each other side by side in the first horizontal direction X. Each of the first plane region P1 and the second plane region P2 may include at least one stack structure.

The first slits S11 may extend in the first horizontal direction X perpendicular to the vertical direction Z and may pass through the stack structure included in the first plane region P1 and the second plane region P2.

The first row decoder region XDEC1 of the fifth memory chip structure may be disposed adjacent to one side of the first plane region P1, and the second row decoder region XDEC2 may be disposed adjacent to one side of the second plane region P2. For example, the first row decoder region XDEC1 and the second row decoder region XDEC2 of the fifth memory chip structure may be spaced apart from each other by a certain distance, and a region between the first row decoder region XDEC1 and the second row decoder region XDEC2 may overlap with the first plane region P1 and the second plane region P2 of the first memory chip structure. The first row decoder region XDEC1 may be a region where a row decoder connected to word lines of memory cells formed in the first plane region P1 is disposed. The second row decoder region XDEC2 may be a region where a row decoder connected to word lines of memory cells formed in the second plane region P2 is disposed. A region of the first memory chip structure that overlaps the first row decoder region XDEC1 and the second row decoder region XDEC2 may be defined as the OFC region. The OFC region OFC may be a region where lines connected to bit lines connected to cell plugs disposed in the first plane region P1 and the second plane region P2 extend to the lower fifth memory chip structure.

The first page buffer region PB1 of the fifth memory chip structure may overlap with the first plane region P1 of the first memory chip structure, and the second page buffer region PB2 of the fifth memory chip structure may overlap with the second plane region P2 of the first memory chip structure. The first page buffer region PB1 may be a region where page buffers connected to bit lines of memory cells included in the first plane region P1 are disposed. The second page buffer region PB2 may be a region where page buffers connected to bit lines of the memory cells included in the second plane region P2 are disposed. The first page buffer region PB1 may be disposed at one end of the second horizontal direction Y in a region overlapping with the first plane region P1, and the second page buffer region PB2 may be disposed at another end of the second horizontal direction Y in a region overlapping the second plane region P2.

FIG. 8B is a diagram illustrating an overlapping region of the second memory chip structure and the fifth memory chip structure.

Referring to FIG. 8B, the third plane region P3 and the fourth plane region P4 of the second memory chip structure may be disposed adjacent to each other side by side in the second horizontal direction Y. Each of the third plane region P3 and the fourth plane region P4 may include at least one stack structure.

The second slits S12 may extend in the second horizontal direction Y perpendicular to the vertical direction Z and may pass through the stack structure included in the third plane region P3 and the fourth plane region P4.

The third row decoder region XDEC3 of the fifth memory chip structure may be disposed adjacent to one side of the third plane region P3, and the fourth row decoder region XDEC4 may be disposed adjacent to one side of the fourth plane region P4. For example, the third row decoder region XDEC3 and the fourth row decoder region XDEC4 of the fifth memory chip structure may be disposed spaced apart from each other by a certain distance, and a region between the third row decoder region XDEC3 and the fourth row decoder region XDEC4 may overlap with the third plane region P3 and the fourth plane region P4 of the second memory chip structure. The third row decoder region XDEC3 may be a region where a row decoder connected to word lines of memory cells formed in the third plane region P3 is disposed. The fourth row decoder region XDEC4 may be a region where a row decoder connected to word lines of memory cells formed in the fourth plane region P4 is disposed. A region of the second memory chip structure that overlaps the third row decoder region XDEC3 and the fourth row decoder region XDEC4 may be defined as the OFC region. The OFC region OFC may be a region where lines connected to bit lines connected to cell plugs disposed in the third plane region P3 and the fourth plane region P4 extend to the lower fifth memory chip structure.

A third page buffer region PB3 of the fifth memory chip structure may overlap with the third plane region P3 of the second memory chip structure, and a fourth page buffer region PB4 of the fifth memory chip structure may overlap with the fourth plane region P4 of the second memory chip structure. The third page buffer region PB3 may be a region where page buffers connected to bit lines of memory cells included in the third plane region P3 are disposed. The fourth page buffer region PB4 may be a region where page buffers connected to bit lines of memory cells included in the fourth plane region P4 are disposed. The third page buffer region PB3 may be disposed at one end of the first horizontal direction X in a region overlapping the third plane region P3, and the fourth page buffer region PB4 may be disposed at another end of the first horizontal direction X in a region overlapping the fourth plane region P4.

FIG. 8C is a diagram illustrating an overlapping region of the first memory chip structure, the second memory chip structure, and the fifth memory chip structure.

Referring to FIG. 8C, the first plane region P1 of FIG. 8A may overlap with a portion of the third plane region P3 of FIG. 8B and a portion of the fourth plane region P4 of FIG. 8B of the second memory chip structure, and the second plane region P2 of FIG. 8A may overlap with a portion of the third plane region P3 of FIG. 8B and a portion of the fourth plane region P4 of FIG. 8B of the second memory chip structure.

In addition, an extension direction of the first slit S11 and an extension direction of the second slit S12 may be orthogonal to each other.

Each of the first to fourth row decoder regions XDEC1 to XDEC4 of the fifth memory chip structure may overlap with an external region adjacent to a region overlapping with the first plane region P1 and the second plane region P2 of the first memory chip structure or a region overlapping the third plane region P3 and the fourth plane region P4 of the second memory chip structure.

Each of the first to fourth page buffer regions PB1 to PB4 of the fifth memory chip structure may overlap with an edge region of a region overlapping with the first plane region P1 and the second plane region P2 of the first memory chip structure or a region overlapping the third plane region P3 and the fourth plane region P4 of the second memory chip structure.

FIGS. 9A to 9F, 10, 11, and 12A to 12D are simplified cross-sectional view schematics illustrating a method of manufacturing a semiconductor memory device according to an embodiment of the present disclosure.

FIGS. 9A to 9F are simplified cross-sectional view schematics illustrating the forming of the first memory chip structure.

Figure 9A:
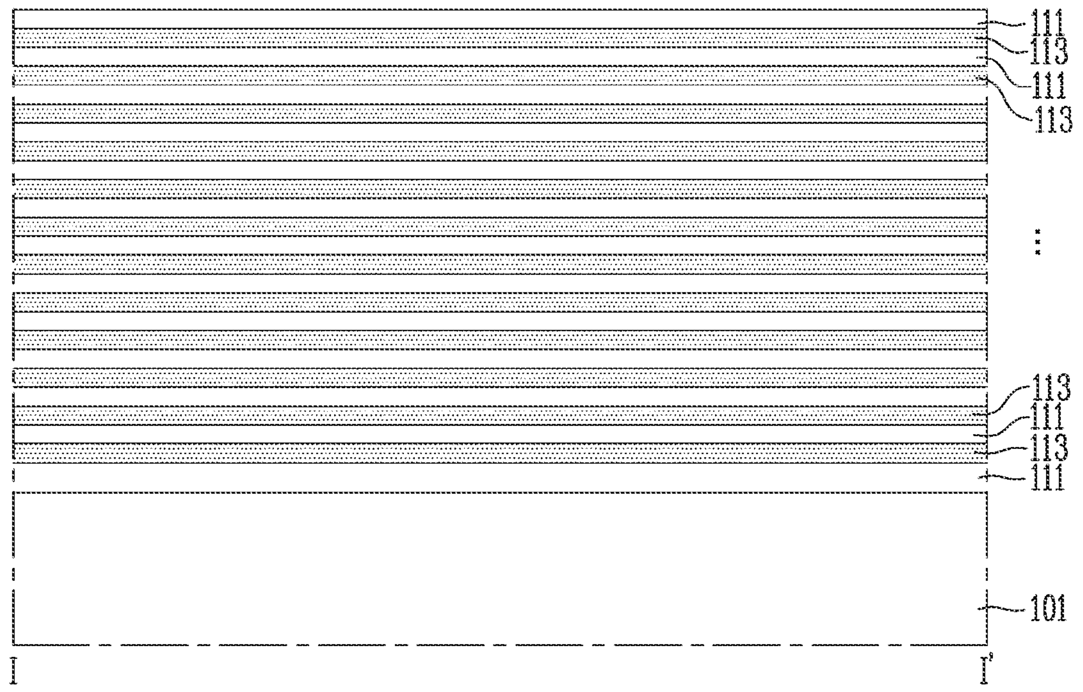
FIGS. 9A to 9F, 10, 11, and 12A to 12D are simplified cross-sectional view schematics illustrating a method of manufacturing a semiconductor memory device according to an embodiment of the present disclosure.

Referring to FIG. 9A, first material layers 111 and second material layers 113 may be alternately stacked layer by layer on a first substrate 101.

The first substrate 101 may be formed of a material having an etch rate different from that of the first material layers 111 and the second material layers 113. For example, the substrate 101 may include silicon.

In an embodiment, the first material layers 111 may be an insulating material for the interlayer insulating layers ILD1 described above with reference to FIG. 3. The second material layers 113 may be a material having an etch rate different from that of the first material layers 111. For example, the first material layers 111 may include silicon oxide, and the second material layers 113 may include silicon nitride. The following drawing illustrates an embodiment in which the first material layers 111 are formed of an insulating material and the second material layers 113 are formed of sacrificial layers, but the present disclosure is not limited thereto. A physical property of the first material layers 111 and the second material layers 113 may be variously changed. For example, the first material layers 111 may be an insulating material for the interlayer dielectric layers ILD1 described above with reference to FIG. 3, and the second material layers 113 may be a conductive material for the word line patterns WP1 described above with reference to FIG. 3.

Figure 9B:
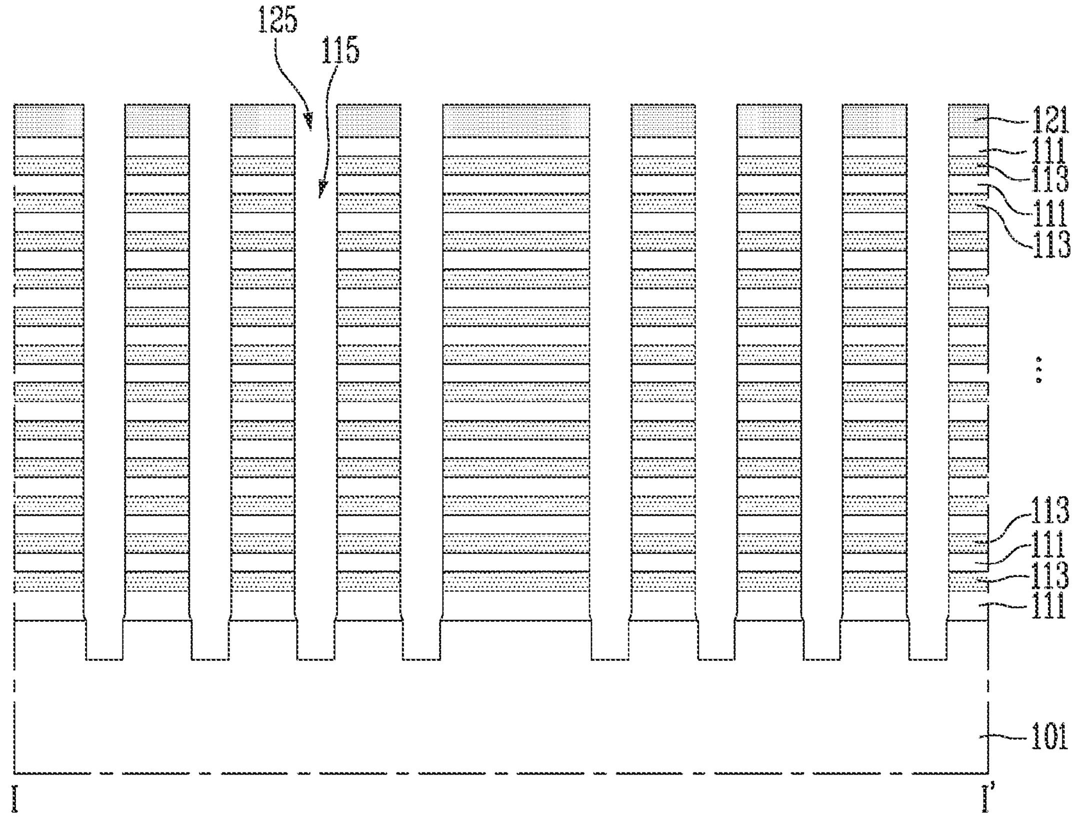

Referring to FIG. 9B, a first mask pattern 121 including first openings 125 may be formed on a stack structure of the first material layers 111 and the second material layers 113. Thereafter, channel holes 115 passing through the first material layers 111 and the second material layers 113 may be formed through the first openings 125 of the first mask pattern 121. The channel holes 115 may extend inside the first substrate 101 to a partial depth. According to an etch material used to form the channel holes 115, the channel holes 115 may be formed in various shapes.

In an embodiment, the channel holes 115 may be formed using a first etch material. An etch speed of the first material layers 111 and the second material layers 113 with respect to the first etch material may be faster than an etch speed of the first substrate 101 with respect to the first etch material. As a result, a width of an end of the channel holes 115 extending into the first substrate 101 may be formed to be narrower than a width of the channel hole 115 passing through the first material layers 111 and the second material layers 113.

Figure 9C:
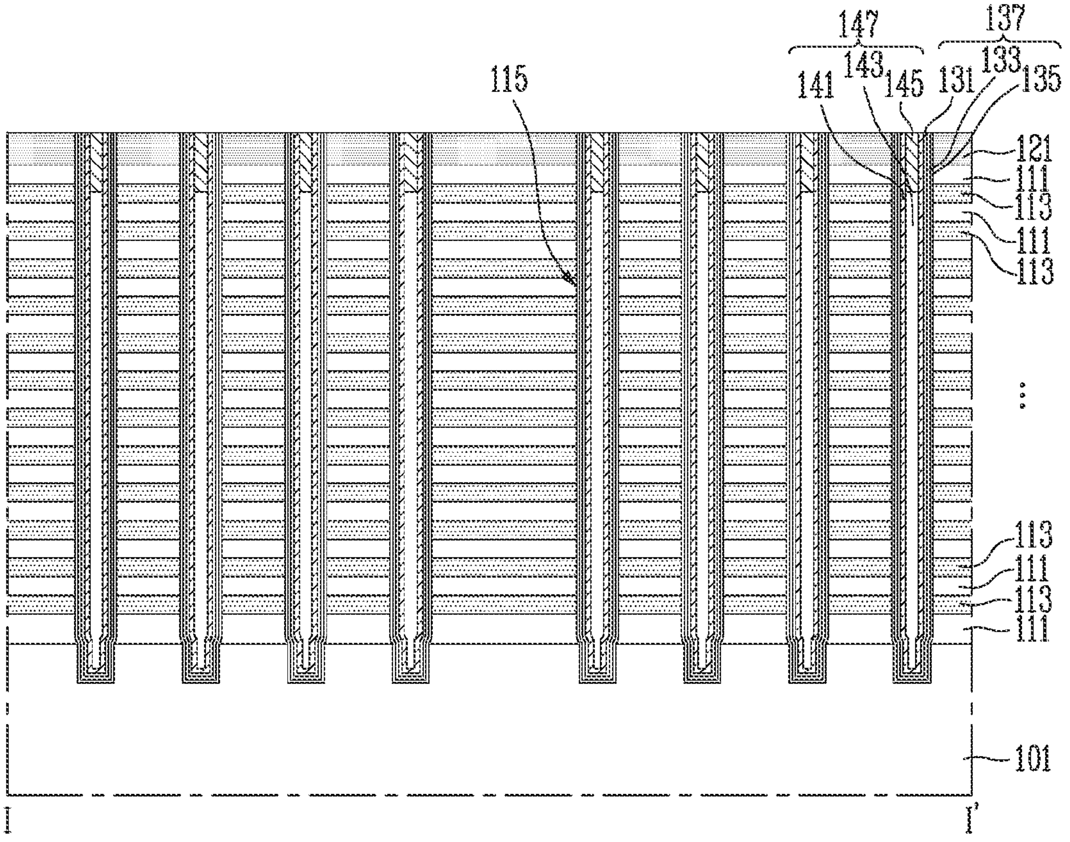

Referring to FIG. 9C, a memory layer 137 and a channel structure 147 may be formed inside the channel holes 115. A sidewall of the channel structure 147 and an end of the channel structure 147 extending into the first substrate 101 may be surrounded by the memory layer 137.

Forming the memory layer 137 may include sequentially stacking a blocking insulating layer 135, a data storage layer 133, and a tunnel insulating layer 131 on a surface of the channel holes 115. The memory layer 137 may be formed in a liner shape, and a central region of the channel holes 115 may be defined by the memory layer 137.

Thereafter, the channel structure 147 may be formed by forming a channel layer 141 on a surface of the memory layer 137. The channel layer 141 may include a semiconductor layer used as a channel region. For example, the channel layer 141 may include undoped polysilicon.

In an embodiment, the channel layer 141 may be formed in a liner shape, and a central region of the channel holes 115 may include a portion that is not filled with the channel layer 141. When the channel layer 141 is formed in the liner shape, forming the channel structure 147 may include filling the central region of the channel holes 115 with a core insulating layer 143 on the channel layer 141, defining a recess region in a portion of the central region of the channel holes 115 by etching a portion of the core insulating layer 143, and filling the recess region with a capping layer 145. The core insulating layer 143 may include an oxide, and the capping layer 145 may include a conductive dopant. The conductive dopant may include an n-type dopant for a junction. The conductive dopant may include a counter-doped p-type dopant.

In another embodiment, the channel layer 141 may be formed to fill the central region of the channel holes 115, and the core insulating layer 143 and the capping layer 145 may be omitted. When the core insulating layer 143 and the capping layer 145 are omitted, forming the channel structure 147 may further include doping an inside of the channel layer 141 with the above-described conductive dopant.

The cell plug CP1 of FIG. 3 may be defined by including the memory layer 137 and the channel structure 147 described above.

Figure 9D:
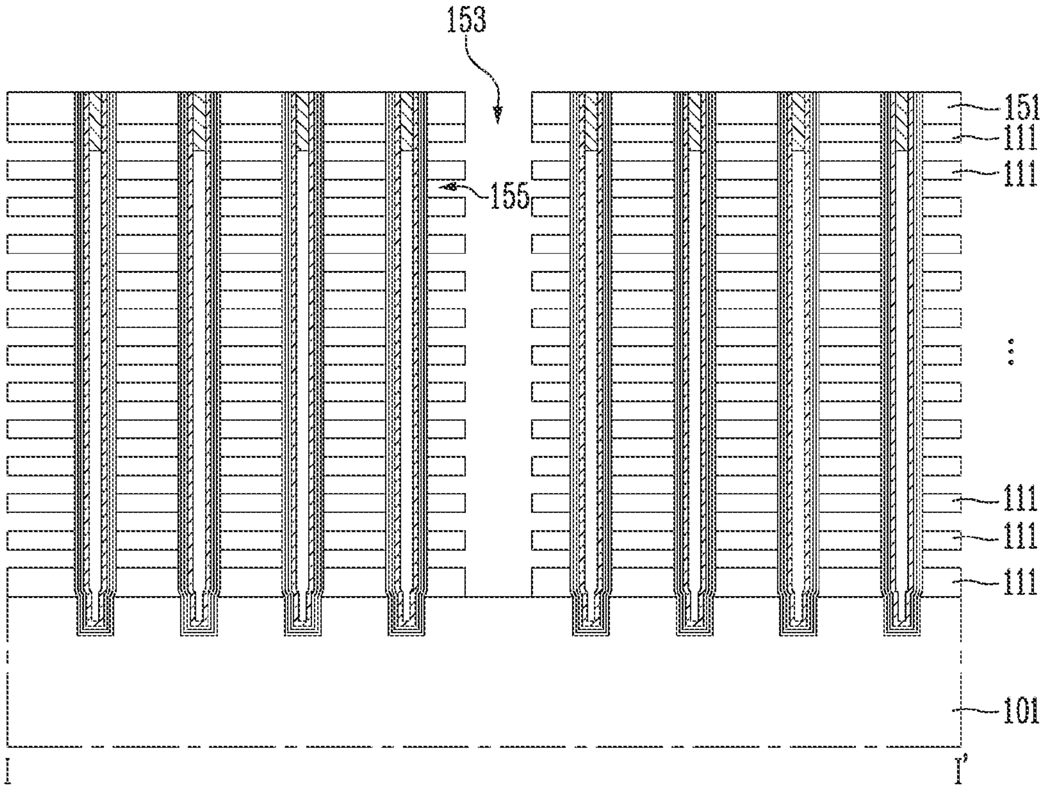

Referring to FIG. 9D, a first insulating layer 151 may be formed after removing the first mask pattern 121 shown in FIG. 9C.

Subsequently, a slit 153 may be formed. The slit 153 may pass through the first insulating layer 151 and may pass through the stack structure of the first material layers 111 and the second material layers 113. The slit 153 may correspond to the second slit S2 shown in FIG. 3. Subsequently, horizontal spaces 155 may be defined by selectively removing the second material layers 113 exposed through the slit 153. The horizontal spaces 155 may be defined between the first material layers 111 adjacent in the vertical direction.

Figure 9E:
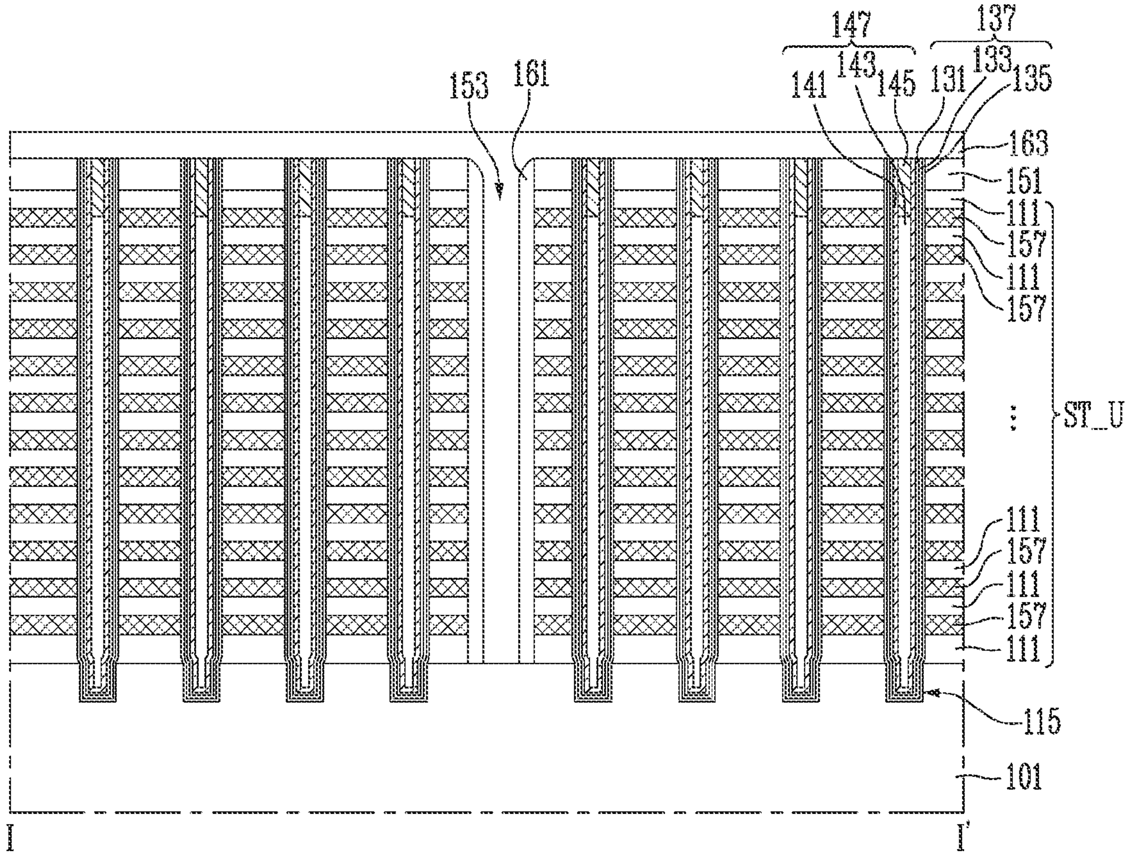

Referring to FIG. 9E, the horizontal spaces 155 shown in FIG. 9D are filled with conductive layers 157 through the slit 153. The conductive layers 157 may be the word line patterns WP1 described above with reference to FIG. 3. The conductive layers 157 may fill the horizontal spaces 155 to surround the channel structure 147 and the memory layer 137.

As described above, a lower stack structure ST_U may be formed on the first substrate 101 by replacing the second material layers 113 as the sacrificial layers with the conductive layers 157 as the word line patterns. The lower stack structure ST_U may correspond to the first stack structure ST1 of FIG. 3. The lower stack structure ST_U may include a structure in which the first material layers 111 as the interlayer insulating layers and the conductive layers 157 as the word line patterns are alternately stacked. The lower stack structure ST_U may be penetrated by the channel structure 147, and the channel structure 147 may extend into the first substrate 101. The memory layer 137 may extend from a region between the channel structure 147 and the lower stack structure ST_U to a region between an end of the channel structure 147 and the first substrate 101.

The first stack structure ST1, the plurality of cell plugs CP1, and the second slits S2 described above with reference to FIG. 3 may be formed through the processes described above with reference to FIGS. 9A to 9E.

Subsequently, a sidewall insulating layer 161 covering a sidewall of the lower stack structure ST_U may be formed. Thereafter, a second insulating layer 163 filling an inside of the slit 153 and extending to cover the sidewall insulating layer 161 and the first insulating layer 151 may be formed.

Figure 9F:
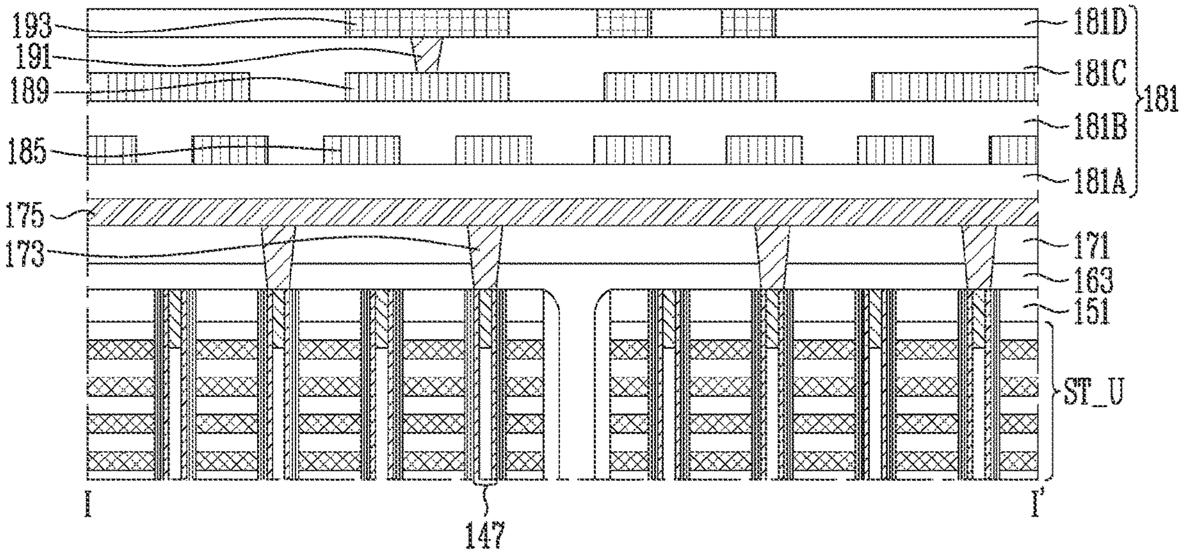

Referring to FIG. 9F, a third insulating layer 171 may be formed on the second insulating layer 163. Subsequently, contact plugs 173 passing through the third insulating layer 171 or passing through the third insulating layer 171 and the second insulating layer 163 may be formed. The contact plugs 173 may extend to contact corresponding channel structures 147.

Subsequently, a first line array 175 may be formed. The first line array 175 may be a bit line connected to the contact plug 173. The first line array 175 may correspond to the bit line BL1 of FIG. 3.

Thereafter, a first insulating structure 181 covering the first line array 175 may be formed. The first insulating structure 181 may include two or more insulating layers 181A to 181D. First connection structures 185, 189, 191, and 193 may be buried inside the first insulating structure 181, and the first connection structures 185, 189, 191, and 193 may be electrically connected through contact plugs (not shown).

The first connection structures 185, 189, 191, and 193 may include a bonding pad 193 having a surface exposed to an outside of the first insulating structure 181. The bonding pad 193 may correspond to the bonding pad BP3 of FIG. 3.

Figure 10:
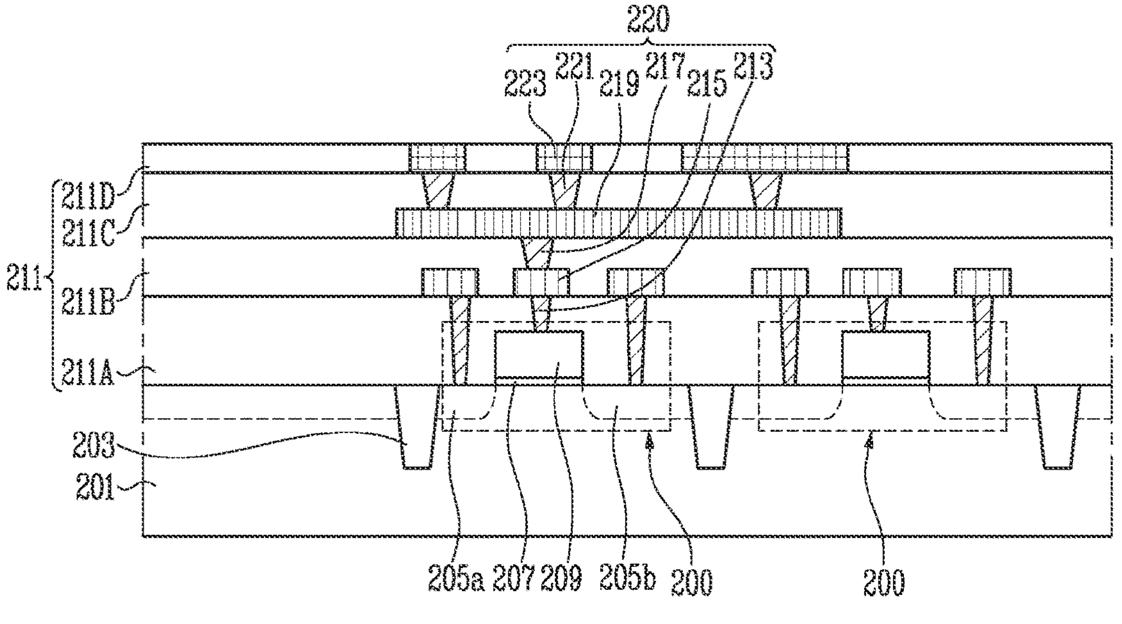

FIG. 10 is a simplified cross-sectional view schematic illustrating forming the fifth memory chip structure.

Referring to FIG. 10, forming a plurality of transistors 200 configuring a complementary metal oxide semiconductor (CMOS) circuit on a second substrate 201 may be included.

The second substrate 201 may be a bulk silicon substrate, a silicon-on-insulator substrate, a germanium substrate, a germanium-on-insulator substrate, a silicon-germanium substrate, or a selective layer formed through a selective epitaxial growth method.

Each of the transistors 200 may be formed in an active region of the second substrate 201 partitioned by an element isolation layer 203. Each of the transistors 200 may include a gate insulating layer 207 and a gate electrode 209 stacked on the active region corresponding thereto, and junctions 205*a* and 205*b* formed in the active region on both sides of the gate electrode 209. The junctions 205*a* and 205*b* may include a conductive dopant for implementing a transistor corresponding thereto. The junctions 205*a* and 205*b* may include at least one of an n-type dopant or a p-type dopant.

After forming the plurality of transistors 200, second connection structures 220 connected to the transistors 200 configuring the CMOS circuit, and a second insulating structure 211 covering the second connection structures 220 and the transistors 200 may be formed.

The second insulating structure 211 may include two or more insulating layers 211A to 211D. The second connection structures 220 may be buried in the second insulating structure 211. Each of the second connection structures 220 may include a plurality of conductive patterns 213, 215, 217, 219, 221, and 223. The second insulating structure 211 and the second connecting structures 220 are not limited to the embodiment shown in the drawing and may be variously changed.

The conductive patterns 213, 215, 217, 219, 221, and 223 included in each of the second connection structures 220 may include a bonding pad 223 having a surface exposed to an outside of the second insulating structure 211. The bonding pad 223 may correspond to the bonding pad BP4 of FIG. 3.

Figure 11:
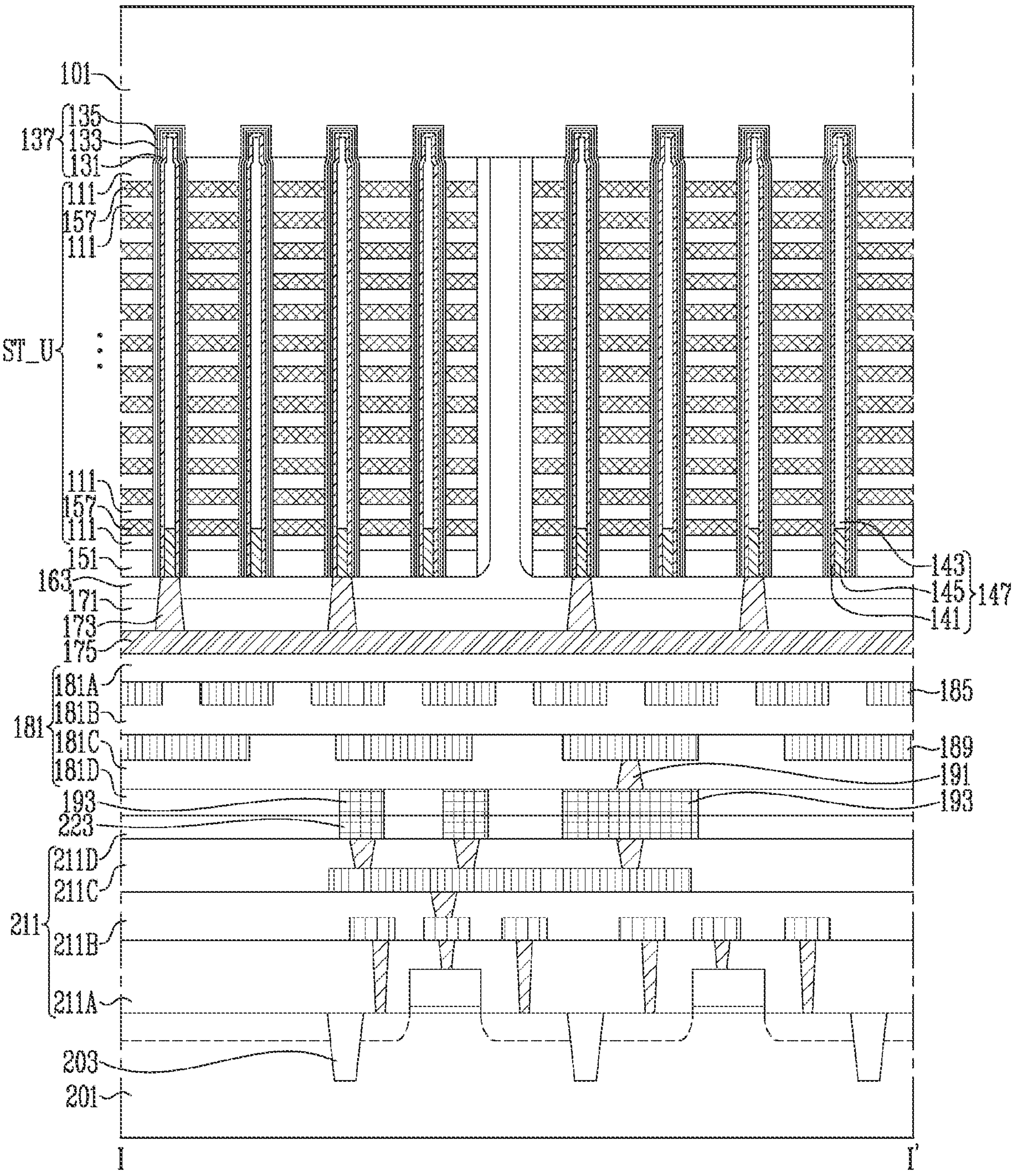

FIG. 11 is a simplified cross-sectional view schematic illustrating bonding the first and fifth memory chip structures to each other.

Referring to FIG. 11, the first substrate 101 and the second substrate 201 are aligned so that the bonding pad 193 on the first substrate 101 and the bonding pad 223 on the second substrate 201 contact each other. The bonding pad 193 and the bonding pad 223 may include various metals, and for example, may include copper.

Thereafter, the bonding pads 193 and 223 are bonded to each other. To this end, after applying heat to both bonding pads 193 and 223, they may be hardened. However, in addition to heat bonding various other processes for connecting the bonding pads 193 and 223 may be used.

FIGS. 12A to 12D are simplified cross-sectional view schematics illustrating forming the second memory chip structure on the first memory chip structure.

Figure 12A:
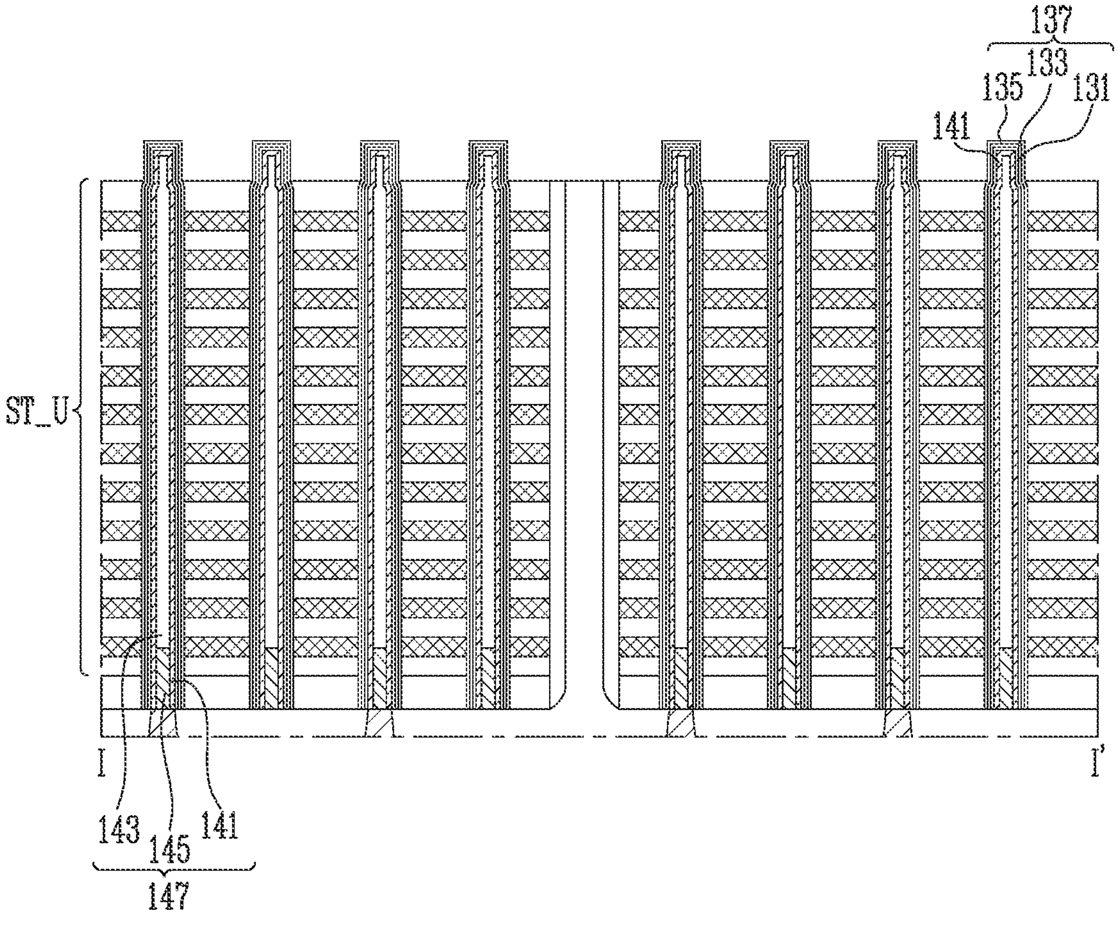

Referring to FIG. 12A, the first substrate 101 shown in FIG. 11 may be removed. When the first substrate 101 is removed, the memory layer 137 may serve as an etch stop layer. Accordingly, the channel structure 147 protruding from the lower stack structure ST_U may be protected by the memory layer 137.

Figure 12B:
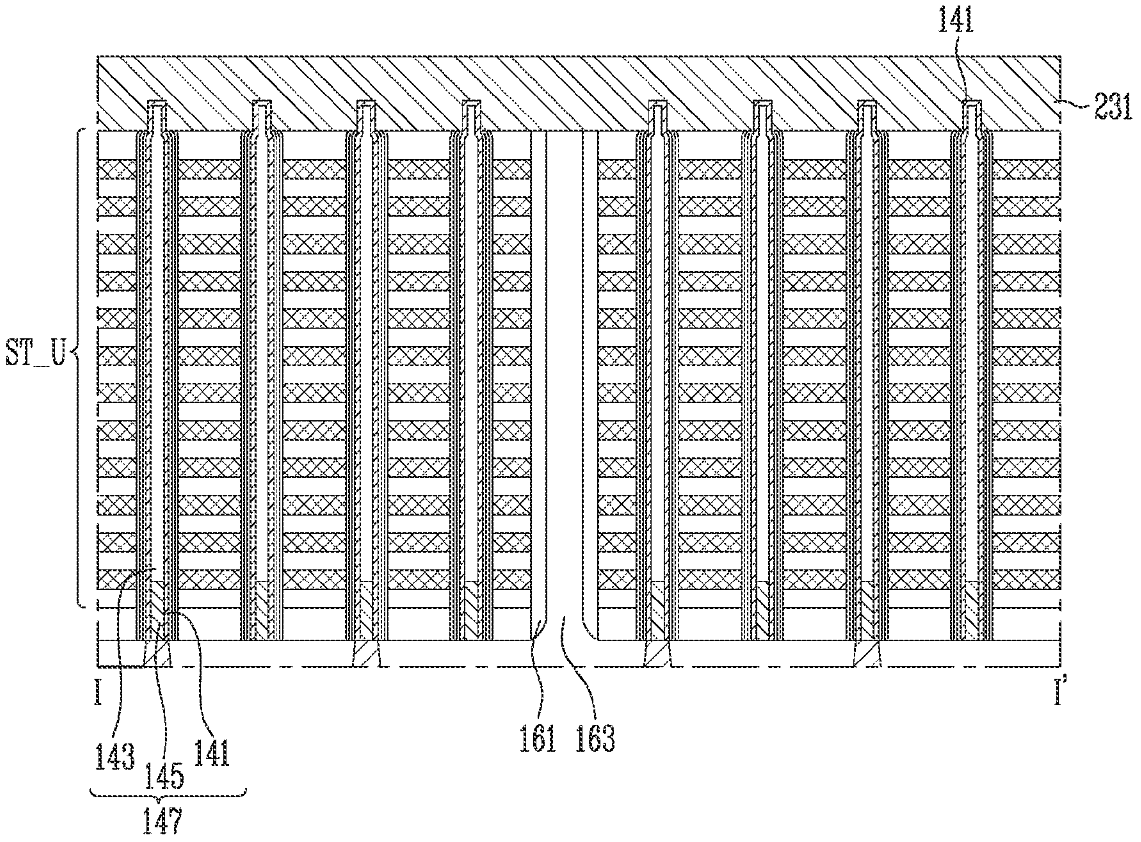

Referring to FIG. 12B, an etching process is performed to etch the exposed memory layer 137 to expose the channel structure 147 protruding from the lower stack structure ST_U. That is, the channel layer 141 protruding from the lower stack structure ST_U is exposed.

Thereafter, a first source line layer 231 covering the lower stack structure ST_U and the exposed channel layer 141 is formed. The first source line layer 231 may correspond to the first source line layer SL1 of FIG. 3. The first source line layer 231 may directly contact the channel layer 141. The first source line layer 231 may be formed of a doped polysilicon layer doped with a dopant.

Figure 12C:
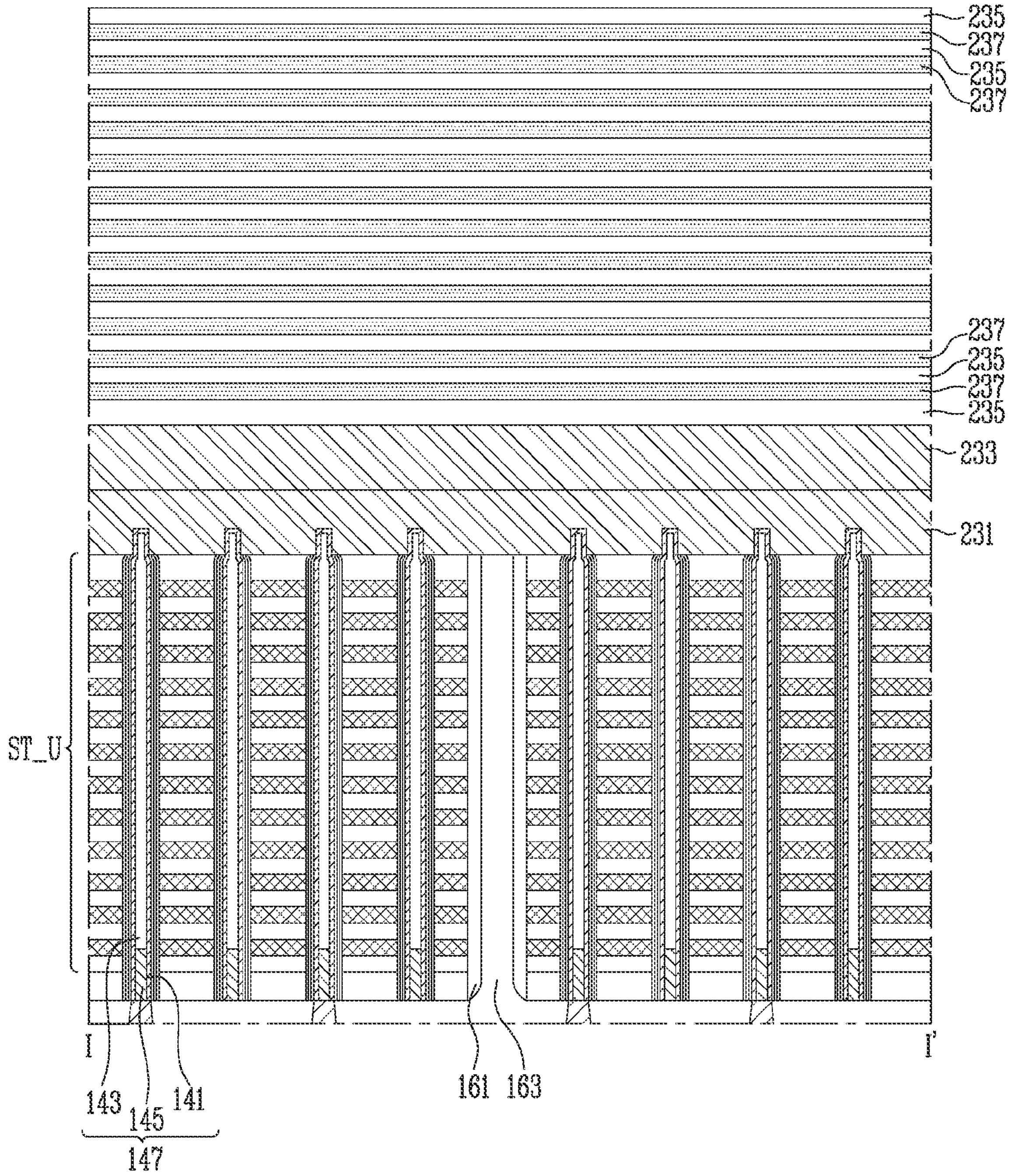

Referring to FIG. 12C, a second source line layer 233 may be formed on the first source line layer 231. The second source line layer 233 may correspond to the second source line layer SL2 of FIG. 3. The second source line layer 233 may be formed of a doped polysilicon layer doped with a dopant.

Thereafter, third material layers 235 and fourth material layers 237 may be alternately stacked layer by layer on the second source line layer 233.

In an embodiment, the third material layers 235 may be the same material as the first material layers 111 of FIG. 9A, and the fourth material layers 237 may be the same material as the second material layers 113 of FIG. 9A.

Figure 12D:
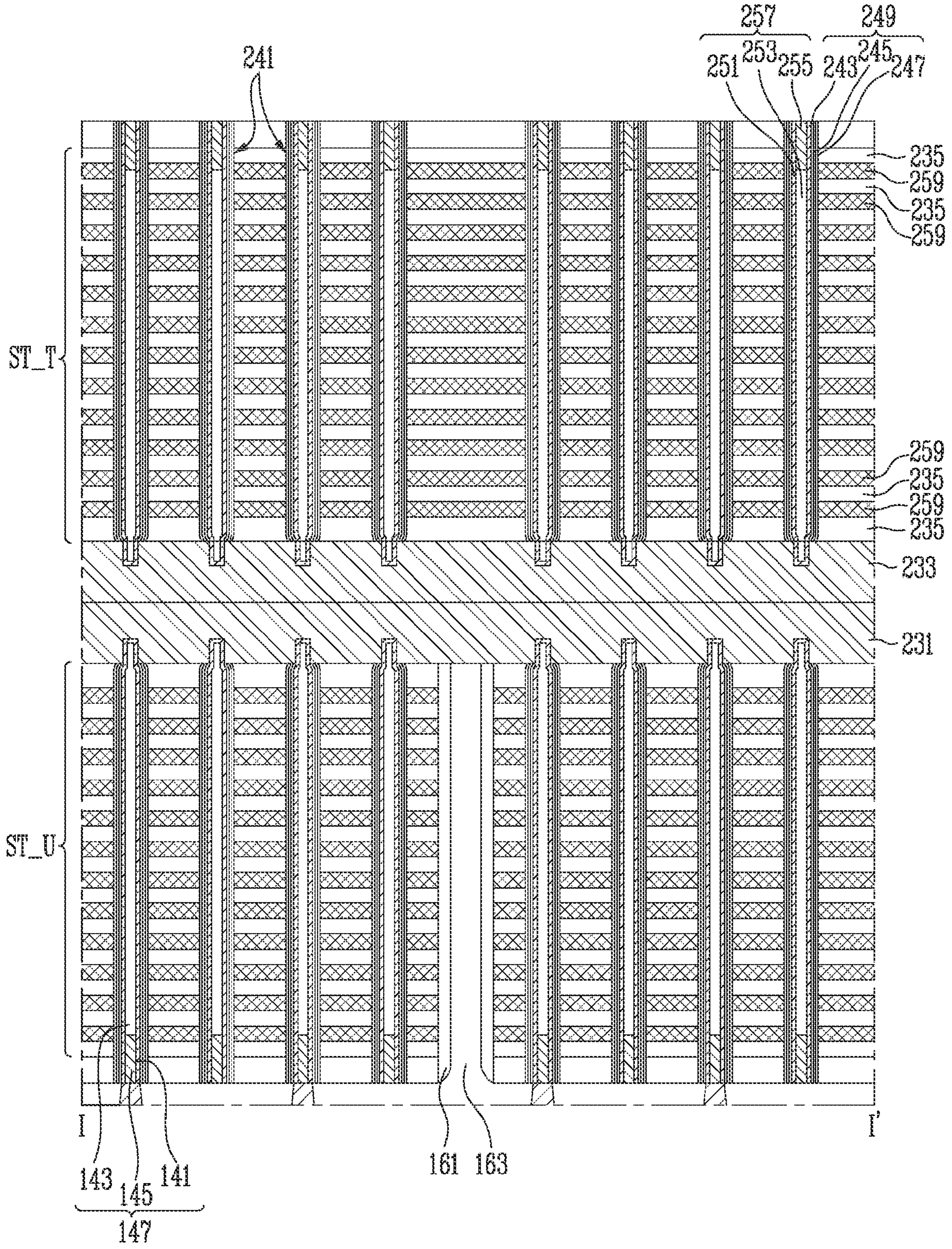

Referring to FIG. 12D, a plurality of channel structures 257 and a memory layer 249 extending in the vertical direction are formed in the third material layers 235 and the fourth material layers 237 of FIG. 12C, and a slit (not shown) passing through the third material layers 235 and the fourth material layers 237 of FIG. 12C in the vertical direction is formed. The slit passing through the third material layers 235 and the fourth material layers 237 of FIG. 12C may extend in a direction horizontally orthogonal to an extension direction of the slit 153 passing through the lower stack structure ST_U.

A method of forming the plurality of channel structures 257 and the memory layer 249 and a method of forming the slit are similar to the method of forming the channel structure 147, the memory layer 137, and the slit 153 described above with reference to FIGS. 9B to 9D, and thus a detailed description is omitted.

Thereafter, the fourth material layers 237 of FIG. 12C exposed through the slit (not shown) are removed, and a removed space is filled with a conductive layer to form word line patterns 259. As described above, an upper stack structure ST_T may be formed by replacing the fourth material layers 237 of FIG. 12C as the sacrificial layers with the word line patterns 259.

Thereafter, the slit may be filled with an insulating material, and additional lines may be formed on the upper stack structure ST_T. A process of forming the additional lines on the upper stack structure ST_T is similar to the method of forming the contact plug 173 and the first line array 175 described above with reference to FIG. 9F, and thus a detailed description is omitted.

Figure 13A:
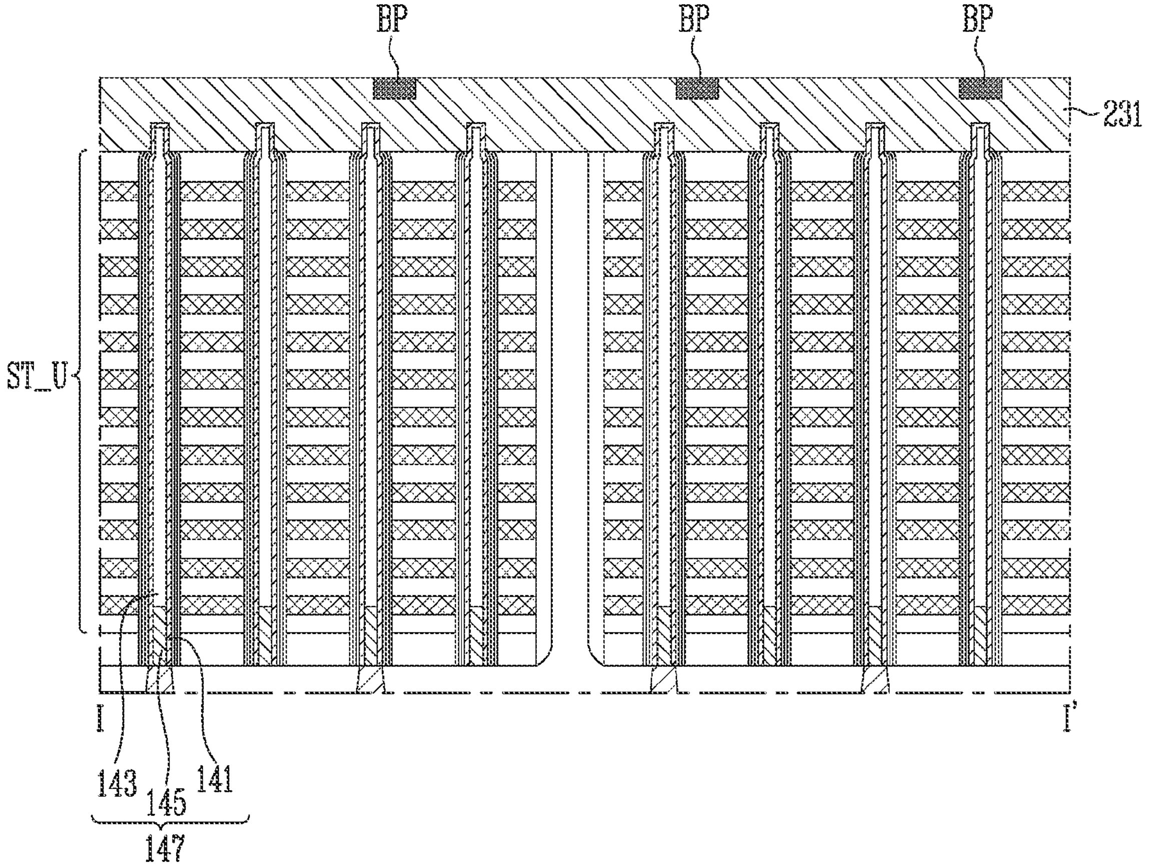
FIGS. 13A and 13B are simplified cross-sectional view schematics illustrating a method of manufacturing a semiconductor memory device according to another embodiment of the present disclosure.
Figure 13B:
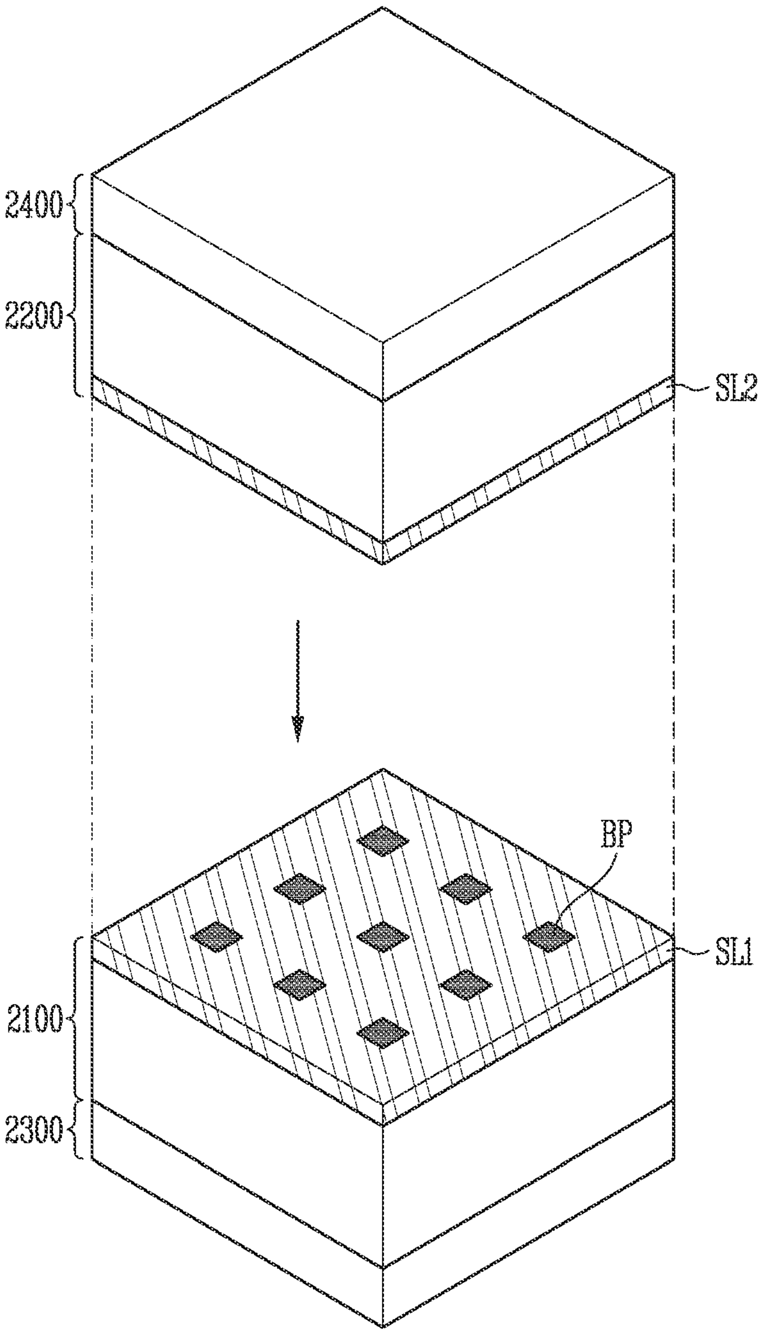

FIGS. 13A and 13B are simplified cross-sectional view schematics illustrating a method of manufacturing a semiconductor memory device according to another embodiment of the present disclosure.

The process operation shown in FIGS. 9A to 9F, 10, and 11 described above are performed to form the first and fifth memory chip structures, and to bond the first and fifth memory chip structures to each other.

Referring to FIG. 13A, the first substrate 101 shown in FIG. 11 may be removed. When the first substrate 101 is removed, the memory layer 137 may serve as an etch stop layer. Accordingly, the channel structure 147 protruding from the lower stack structure ST_U may be protected by the memory layer 137.

Thereafter, an etching process may be performed to etch the exposed memory layer 137 to expose the channel structure 147 protruding from the lower stack structure ST_U. That is, the channel layer 141 protruding from the lower stack structure ST_U is exposed.

Thereafter, the first source line layer 231 covering the lower stack structure ST_U and the exposed channel layer 141 is formed. The first source line layer 231 may correspond to the first source line layer SL1 of FIG. 3. The first source line layer 231 directly contacts the channel layer 141. The first source line layer 231 may be formed of a doped polysilicon layer doped with a dopant.

Thereafter, the bonding pads BP are formed on the first source line layer 231. The bonding pads BP may be formed in the first source line layer 231, and thus a surface may be exposed.

The first memory chip structure 2100 and the third memory chip structure 2300 may be formed according to the process operation shown in FIGS. 9A to 9F, 10, 11, and 12A. The first memory chip structure 2100 and the third memory chip structure 2300 may be bonded to each other by a bonding structure.

In addition, the second memory chip structure 2200 and the fourth memory chip structure 2400 may be formed according to the process operation shown in FIGS. 9A to 9F, 10, 11, and 12A. The second memory chip structure 2200 and the fourth memory chip structure 2400 may be bonded to each other by a bonding structure.

Referring to FIG. 13B, the first source line layer SL1 of the first memory chip structure 2100 and the second source line layer SL2 of the second memory chip structure 2200 are aligned to face each other, and then a bonding process is performed. At this time, it may be aligned so that a horizontal extension direction of the slit of the first memory chip structure 2100 and a horizontal extension direction of the slit of the second memory chip structure 2200 are orthogonal to each other.

Thereafter, a bonding process is performed to bond the first and second memory chip structures 2100 and 2200.

Figure 14:
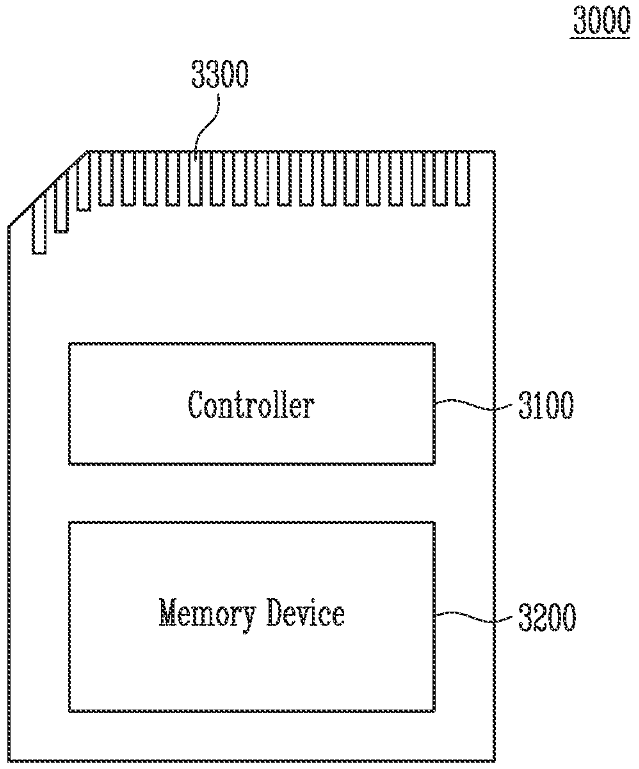
FIG. 14 is a diagram illustrating a memory card system to which a semiconductor memory device of the present disclosure is applied.

FIG. 14 is a diagram illustrating a memory card system to which a semiconductor memory device of the present disclosure is applied.

Referring to FIG. 14, the memory card system 3000 includes a controller 3100, a memory device 3200, and a connector 3300.

The controller 3100 is connected to the memory device 3200. The controller 3100 is configured to access the memory device 3200. For example, the controller 3100 may be configured to control a program, read, or erase operation of the memory device 3200 or to control a background operation. The controller 3100 is configured to provide an interface between the memory device 3200 and a host. The controller 3100 is configured to drive firmware for controlling the memory device 3200. For example, the controller 3100 may include components such as a random access memory (RAM), a processing unit, a host interface, a memory interface, and an error correction circuit.

The controller 3100 may communicate with an external device through the connector 3300. The controller 3100 may communicate with an external device (for example, the host) according to a specific communication standard. For example, the controller 3100 is configured to communicate with an external device through at least one of various communication standards or interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards or interfaces described above.

The memory device 3200 may include a plurality of semiconductor memory devices, and each of the plurality of semiconductor memory devices may be configured identically to the semiconductor memory device 100 shown in FIG. 1.

The controller 3100 and the memory device 3200 may be integrated into one semiconductor device to configure a memory card. For example, the controller 3100 and the memory device 3200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 15:
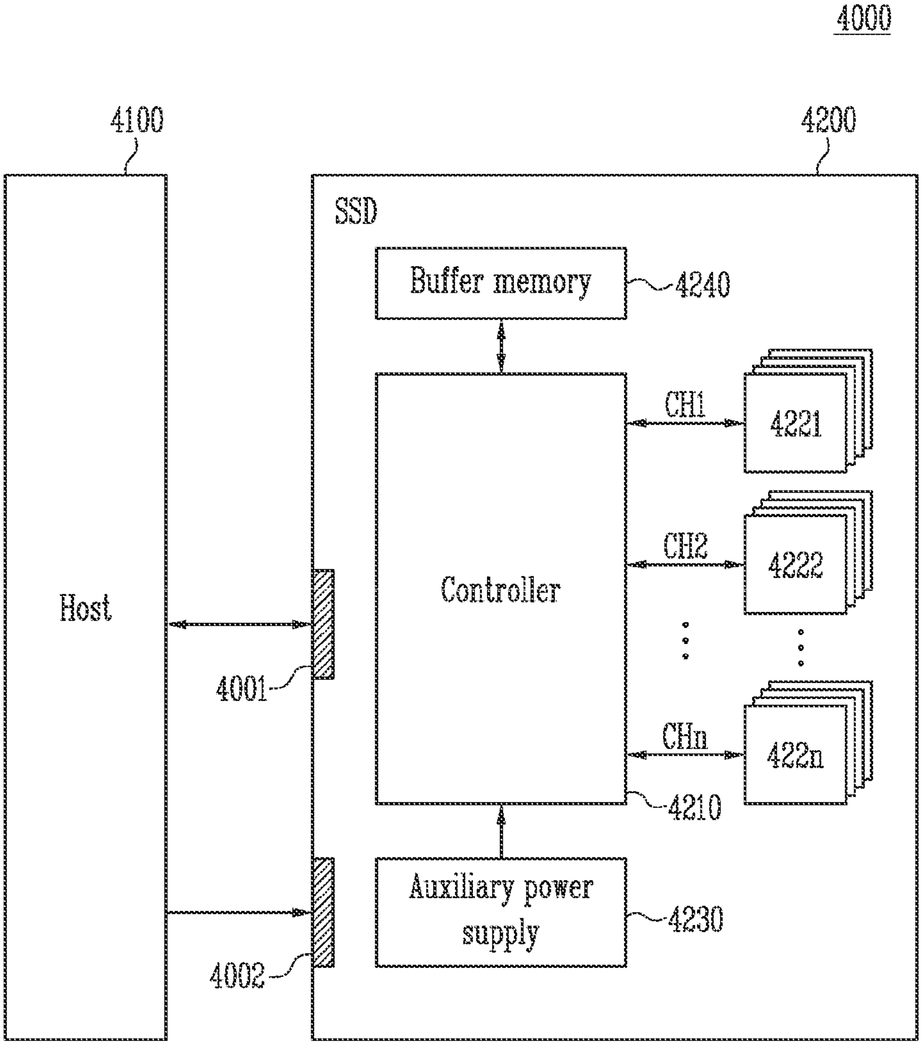
FIG. 15 is a diagram illustrating a solid state drive (SSD) system to which a semiconductor memory device of the present disclosure is applied.

FIG. 15 is a diagram illustrating a solid state drive (SSD) system employing a semiconductor memory device of the present disclosure.

Referring to FIG. 15, the SSD system 4000 includes a host 4100 and an SSD 4200. The SSD 4200 exchanges a signal with the host 4100 through a signal connector 4001 and receives power through a power connector 4002. The SSD 4200 includes a controller 4210, a plurality of semiconductor memory devices 4221 to 422*n*, an auxiliary power supply 4230, and a buffer memory 4240.

The controller 4210 may control the plurality of semiconductor memory devices 4221 to 422*n* in response to the signal received from the host 4100. For example, the signals may be signals based on an interface between the host 4100 and the SSD 4200. For example, the signal may be a signal defined by at least one of communication standards or interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The plurality of semiconductor memory devices 4221 to 422*n* may include a plurality of memory cells configured to store data. Each of the plurality of semiconductor memory devices 4221 to 422*n* may be configured identically to the semiconductor memory device 100 shown in FIG. 1. The plurality of memory devices 4221 to 422*n* may communicate with the controller 4210 through respective channels CH1 to CHn.

The auxiliary power supply 4230 is connected to the host 4100 through the power connector 4002. The auxiliary power supply 4230 may receive a power voltage from the host 4100 and charge the power voltage. The auxiliary power supply 4230 may provide a power voltage of the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 operates as a buffer memory of the SSD 4200 temporarily storing data received from the host 4100 or from one of the plurality of semiconductor memory devices 4221 to 422*n*. The buffer memory may also temporarily store meta data (for example, a mapping table) of the semiconductor memory devices 4221 to 422*n*. The buffer memory 4240 may include a volatile memory such as a DRAM, an SDRAM, a DDR SDRAM, and an LPDDR SDRAM, or a nonvolatile memory such as an FRAM, a ReRAM, an STT-MRAM, and a PRAM.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A semiconductor memory device comprising:

a first memory chip structure including first and second plane regions each including a plurality of first stack structures;

a second memory chip structure bonded to a top surface of surface of the first memory chip structure in a vertical direction and including third and fourth plane regions each including a plurality of second stack structures; and a third memory chip structure bonded to a bottom surface of the first memory chip structure in the vertical direction, and including first and second page buffer regions where a page buffer for controlling an operation of memory cells included in the first memory chip structure and the second memory chip structure is disposed, and first and second row decoder regions where a row decoder for controlling the operation of the memory cells is disposed, wherein the first memory chip structure includes first slits passing through the plurality of first stack structures in the vertical direction and extending in a first horizontal direction orthogonal to the vertical direction, and wherein the second memory chip structure includes second slits passing through the plurality of second stack structures in the vertical direction and extending in a second horizontal direction orthogonal to the vertical direction and the first horizontal direction, wherein the first page buffer region extends in the first horizontal direction, and overlaps one of the plurality of the first stack structure, and wherein the second page buffer region extends in the second horizontal direction, and overlaps one of the plurality of the second stack structure.

2. The semiconductor memory device of claim 1, wherein a plurality of first source line layers corresponding to the plurality of respective first stack structures are exposed on a top surface of surface of the first memory chip structure, wherein a plurality of second source line layers corresponding to the plurality of respective second stack structures are exposed on a bottom surface of the second memory chip structure, and wherein the plurality of first source line layers and the plurality of second source line layers directly contact each other.

3. The semiconductor memory device of claim 1, wherein the first row decoder region includes a first row decoder for controlling the memory cells included in the memory chip structure, wherein the first row decoder region overlaps a region between the plurality of first stack structures of the first plane region and a region between the plurality of first stack structures of the second plane region, and wherein the second row decoder region where a second row decoder for controlling the memory cells included in the second memory chip structure is disposed overlaps a region between the plurality of second stack structures of the third plane region and a region between the plurality of second stack structures of the fourth plane region.

4. The semiconductor memory device of claim 3, wherein the first page buffer region includes a first page buffer for controlling the memory cells included in the first memory chip structure, wherein the first page buffer region overlaps at least one first stack structure among the plurality of first stack structures, and wherein the second page buffer region where a second page buffer for controlling the memory cells included in the second memory chip structure is disposed overlaps a region between the plurality of first stack structures of the first plane region and a region between the plurality of first stack structures of the second plane region.

5. The semiconductor memory device of claim 4, wherein the first row decoder region and the second page buffer region are disposed adjacent to each other.

6. The semiconductor memory device of claim 1, wherein the first memory chip structure includes, a first source line layer;

a first stack structure disposed over the first source line layer, and the first stack structure including a plurality of first insulating layers and a plurality of first word line patterns;

a first channel structure extending in the vertical direction, where the first channel structure penetrates the first stack structure, and the first channel structure including a first channel layer; and a first memory layer surrounding a side wall of the first channel structure, wherein the first channel layer extends into the first source line layer, and wherein an end portion of the first memory layer contacts to one surface of the first source line layer.

7. The semiconductor memory device of claim 6, wherein the second memory chip structure includes, a second source line layer;

a second stack structure disposed over the second source line layer, and the second stack structure including a plurality of second insulating layers and a plurality of second word line patterns;

a second channel structure extending in the vertical direction, where the second channel structure penetrates the second stack structure, and the second channel structure including a second channel layer; and a second memory layer surrounding a side wall of the second channel structure, wherein the second channel layer extends into the second source line layer, and wherein an end portion of the second memory layer contacts to one surface of the second source line layer.

8. The semiconductor memory device of claim 1, wherein the first memory chip structure includes, a first source line layer;

a first stack structure disposed over the first source line layer, and the first stack structure including a plurality of first insulating layers and a plurality of first word line patterns;

a first channel structure extending in the vertical direction, where the first channel structure penetrates the first stack structure, and the first channel structure including a first channel layer; and a first memory layer surrounding a side wall of the first channel structure, wherein the second memory chip structure includes, a second source line layer;

a second stack structure disposed over the second source line layer, and the second stack structure including a plurality of second insulating layers and a plurality of second word line patterns;

a second channel structure extending in the vertical direction, where the second channel structure penetrates the second stack structure, and the second channel structure including a second channel layer; and a second memory layer surrounding a side wall of the second channel structure, wherein one surface of the first source line layer contacts to one surface of the second source line layer.

9. The semiconductor memory device of claim 8, wherein the first channel layer extends into the first source line layer, and wherein an end portion of the first memory layer contacts to the one surface of the first source line layer.

10. A semiconductor memory device comprising:

a first memory chip structure including first to fourth stack structures arranged in a matrix form;

a second memory chip structure bonded to a top surface of the first memory chip structure in a vertical direction and including fifth to eighth stack structures arranged in the matrix form; and a third memory chip structure bonded to a bottom surface of the first memory chip structure in the vertical direction, and including first and second page buffer regions where a page buffer for controlling an operation of memory cells included in the first memory chip structure and the second memory chip structure is disposed, and first to eighth row decoder regions where a row decoder for controlling the operation of the memory cells is disposed, wherein the first memory chip structure includes first slits passing through the plurality of first stack structures in the vertical direction and extending in a first horizontal direction orthogonal to the vertical direction, and wherein the second memory chip structure includes second slits passing through the plurality of second stack structures in the vertical direction and extending in a second horizontal direction orthogonal to the vertical direction and the first horizontal direction, wherein the first page buffer region extends in the first horizontal direction, and overlaps one of the plurality of the first stack structure, and wherein the second page buffer region extends in the second horizontal direction, and overlaps one of the plurality of the second stack structure.

11. The semiconductor memory device of claim 10, wherein a plurality of first source line layers corresponding to each of the first to fourth stack structures are exposed on a top surface of the first memory chip structure, wherein a plurality of second source line layers corresponding to each of the fifth to eighth stack structures are exposed on a bottom surface of the second memory chip structure, and wherein the plurality of first source line layers and the plurality of second source line layers directly contact each other.

12. The semiconductor memory device of claim 10, wherein the first row decoder region and the second row decoder region include the row decoder respectively corresponding to the first stack structure and the second stack structure, wherein the first row decoder region and the second row decoder region overlap with a region between the first stack structure and the second stack structure, wherein the third row decoder region and the fourth row decoder region where the row decoder respectively corresponding to the third stack structure and the fourth stack structure overlap with a region between the third stack structure and the fourth stack structure, wherein the fifth row decoder region and the sixth row decoder region where the row decoder respectively corresponding to the fifth stack structure and the sixth stack structure overlap with a region between the fifth stack structure and the sixth stack structure, and wherein the seventh row decoder region and the eighth row decoder region where the row decoder respectively corresponding to the seventh stack structure and the eighth stack structure overlap with a region between the seventh stack structure and the eighth stack structure.

13. The semiconductor memory device of claim 12, wherein the first page buffer region includes a first page buffer for controlling the memory cells included in the first memory chip structure, wherein the first page buffer region is disposed between the fifth row decoder region and the sixth row decoder region or between the seventh row decoder region and the eighth row decoder region, and wherein the second page buffer region where a second page buffer for controlling the memory cells included in the second memory chip structure is disposed, is disposed between the first row decoder region and the second row decoder region or between the third row decoder region and the fourth row decoder region.

14. A semiconductor memory device comprising:

a first memory chip structure including first and second plane regions each including a plurality of first stack structures;

a second memory chip structure bonded to a top surface of surface of the first memory chip structure in a vertical direction and including third and fourth plane regions each including a plurality of second stack structures; and a third memory chip structure bonded to a bottom surface of the first memory chip structure in the vertical direction, and including first to fourth page buffer regions where a page buffer for controlling an operation of memory cells included in the first memory chip structure and the second memory chip structure is disposed, and first to fourth row decoder regions where a row decoder for controlling the operation of the memory cells is disposed, wherein the first memory chip structure includes first slits passing through the plurality of first stack structures in the vertical direction and extending in a first horizontal direction orthogonal to the vertical direction, and wherein the second memory chip structure includes second slits passing through the plurality of second stack structures in the vertical direction and extending in a second horizontal direction orthogonal to the vertical direction and the first horizontal direction, wherein the first page buffer region extends in the first horizontal direction, and overlaps one of the plurality of the first stack structure, and wherein the second page buffer region extends in the second horizontal direction, and overlaps one of the plurality of the second stack structure.

15. The semiconductor memory device of claim 14, wherein a plurality of first source line layers corresponding to the plurality of respective first stack structures are exposed on a top surface of surface of the first memory chip structure, wherein a plurality of second source line layers corresponding to the plurality of respective second stack structures are exposed on a bottom surface of the second memory chip structure, and wherein the plurality of first source line layers and the plurality of second source line layers directly contact each other.

16. The semiconductor memory device of claim 14, wherein the first to fourth row decoder regions overlap with an external region adjacent to the first and second plane regions or the third and fourth plane regions.

17. The semiconductor memory device of claim 14, wherein the first page buffer region where a first page buffer for controlling the memory cells included in the first plane region is disposed, is disposed to overlap with a region where the first plane region and the third plane region overlap, wherein the second page buffer region where a second page buffer for controlling the memory cells included in the second plane region is disposed, is disposed to overlap with a region where the second plane region and the fourth plane region overlap, wherein the third page buffer region where a third page buffer for controlling the memory cells included in the third plane region is disposed, is disposed to overlap with a region where the second plane region and the third plane region overlap, and wherein the fourth page buffer region where a fourth page buffer for controlling the memory cells included in the fourth plane region is disposed, is disposed to overlap with a region where the first plane region and the fourth plane region overlap.

18. A method of manufacturing a semiconductor memory device, the method comprising:

forming a first stack structure, and forming, by the first stack structure, a lower stack structure including first interlayer insulating layers and second word line patterns alternately stacked in a vertical direction, first cell plugs having an end extending upwardly by passing through the lower stack structures, a plurality of first slits extending in a first horizontal direction orthogonal to the vertical direction by passing through the lower stack structure in the vertical direction, and a first source line layer stacked on the lower stack structure and connected to the end of first cell plugs; and forming a second stack structure on the first stack structure, and forming a second source line layer directly contacting the first source line layer, an upper stack structure including second interlayer insulating layers and third word line patterns alternately stacked in the vertical direction, second cell plugs extending downwardly by passing through the upper stack structure and having an end contacting the second source line layer, a plurality of second slits extending in a second horizontal direction orthogonal to the vertical direction and the first horizontal direction by passing through the upper stack structure in the vertical direction, wherein the first page buffer region extends in the first horizontal direction, and overlaps one of the plurality of the first stack structure, and wherein the second page buffer region extends in the second horizontal direction, and overlaps one of the plurality of the second stack structure.

19. A semiconductor memory device comprising:

a first memory chip structure including first and second plane regions each including a plurality of first stack structures;

a second memory chip structure bonded to a top surface of surface of the first memory chip structure in a vertical direction and including third and fourth plane regions each including a plurality of second stack structures; and a third memory chip structure bonded to a bottom surface of the first memory chip structure in the vertical direction, and including a first page buffer where a page buffer for controlling an operation of memory cells included in the first memory chip structure, and first row decoder region where a row decoder for controlling the operation of the memory cells is disposed, a fourth memory chip structure bonded to a top surface of the second memory chip structure in the vertical direction, and including second page buffer where a page buffer for controlling an operation of memory cells included in the second memory chip structure, and second row decoder region where a row decoder for controlling the operation of the memory cells is disposed, wherein the first memory chip structure includes first slits passing through the plurality of first stack structures in the vertical direction and extending in a first horizontal direction orthogonal to the vertical direction, and wherein the second memory chip structure includes second slits passing through the plurality of second stack structures in the vertical direction and extending in a second horizontal direction orthogonal to the vertical direction and the first horizontal direction, wherein the first page buffer region extends in the first horizontal direction, and overlaps one of the plurality of the first stack structure, and wherein the second page buffer region extends in the second horizontal direction, and overlaps one of the plurality of the second stack structure.

* * * * *